United States Patent
El-Gamal et al.

(10) Patent No.: US 10,197,590 B2
(45) Date of Patent: Feb. 5, 2019

(54) COMBINED MAGNETOMETER ACCELEROMETER MEMS DEVICES AND METHODS

(71) Applicant: THE ROYAL INSTITUTION FOR THE ADVANCEMENT OF LEARNING/MCGILL UNIVERSITY, Montreal (CA)

(72) Inventors: Mourad El-Gamal, Brossard (CA); Mohannad Elsayed, Verdun (CA); Paul-Vahe Cicek, Montreal (CA); Frederic Nabki, Montreal (CA)

(73) Assignee: THE ROYAL INSTITUTION FOR THE ADVANCEMENT OF LEARNING/MCGILL UNIVERSITY, Montreal (CA)

( * ) Notice: Subject to any disclaimer, the term of this patent is extended or adjusted under 35 U.S.C. 154(b) by 175 days.

(21) Appl. No.: 14/943,498

(22) Filed: Nov. 17, 2015

(65) Prior Publication Data
US 2016/0139173 A1     May 19, 2016

Related U.S. Application Data

(60) Provisional application No. 62/080,637, filed on Nov. 17, 2014.

(51) Int. Cl.
*G01P 15/125* (2006.01)
*B81B 7/00* (2006.01)
(Continued)

(52) U.S. Cl.
CPC ............ *G01P 15/125* (2013.01); *B81B 7/008* (2013.01); *B81C 1/00015* (2013.01);
(Continued)

(58) Field of Classification Search
CPC .. G01P 15/125; G01P 15/18; G01P 2015/084; G01R 33/0286; B81B 7/008; B81B 2201/0235; B81C 1/00015
See application file for complete search history.

(56) References Cited

U.S. PATENT DOCUMENTS

| | | | | |
|---|---|---|---|---|
| 4,653,326 A | * | 3/1987 | Danel | G01P 15/0802 73/514.21 |
| 4,912,990 A | * | 4/1990 | Norling | G01L 1/183 73/862.59 |

(Continued)

OTHER PUBLICATIONS

D. Ettelt et al., "A Novel Microfabricated High Precision Vector Magnetometer," Proc. IEEE Conf. on Sensors, pp. 2010-2013, Oct. 2011.

(Continued)

*Primary Examiner* — David Bolduc
(74) *Attorney, Agent, or Firm* — Norton Rose Fulbright Canada LLP

(57) ABSTRACT

Considerations for selecting capacitive sensors include accuracy, repeatability, long-term stability, ease of calibration, resistance to chemical and physical contaminants, size, packaging, integration options with other sensors and/or electronics, and cost effectiveness. It is beneficial if such sensors are amenable to above-IC integration with associated control/readout circuitry for reduced parasitics and reduced footprint through area sharing. The inventors have established a combined Lorentz force based magnetometer and accelerometer MEMS sensor exploiting a low temperature, above-IC-compatible fabrication process operating without requiring vacuum packaging. By switching an electrical current between two perpendicular directions on the device structure a 2D in-plane magnetic field measurement can be achieved while concurrently, the device serves as a 1D accelerometer for out-of-plane acceleration, by switch- (Continued)

ing the current off and by monitoring the structure's capacitive change in response to acceleration. The design can thus separate magnetic and inertial force measurements, utilizing a single compact device.

6 Claims, 16 Drawing Sheets

(51) Int. Cl.
  *B81C 1/00* (2006.01)
  *G01R 33/028* (2006.01)
  *G01P 15/18* (2013.01)
  *G01P 15/08* (2006.01)
(52) U.S. Cl.
  CPC .......... *G01P 15/18* (2013.01); *G01R 33/0286* (2013.01); *B81B 2201/0235* (2013.01); *G01P 2015/084* (2013.01)

(56) References Cited

U.S. PATENT DOCUMENTS

| | | | | |
|---|---|---|---|---|
| 4,951,510 | A * | 8/1990 | Holm-Kennedy | G01P 15/0802 73/510 |
| 5,083,466 | A * | 1/1992 | Holm-Kennedy | G01P 15/0802 73/514.33 |
| 5,095,762 | A * | 3/1992 | Holm-Kennedy | G01P 15/0802 73/382 R |
| 5,101,669 | A * | 4/1992 | Holm-Kennedy | G01P 15/0802 361/278 |
| 5,265,470 | A * | 11/1993 | Kaiser | G01P 15/0894 250/338.1 |
| 5,293,781 | A * | 3/1994 | Kaiser | G01P 15/0894 250/307 |
| 5,315,247 | A * | 5/1994 | Kaiser | G01P 15/0894 324/244 |
| 5,739,431 | A * | 4/1998 | Petri | E21B 47/02 324/260 |
| 7,784,344 | B2 * | 8/2010 | Pavelescu | G01D 21/02 73/510 |
| 8,975,104 | B2 | 3/2015 | El-Gamal et al. | |
| 2002/0017134 | A1 * | 2/2002 | Sakurai | G01C 19/56 73/504.02 |
| 2004/0107775 | A1 * | 6/2004 | Kim | G01D 5/24 73/714 |
| 2004/0158439 | A1 * | 8/2004 | Kim | G01D 21/02 702/190 |
| 2005/0091843 | A1 * | 5/2005 | Yu | B81C 3/002 29/830 |
| 2007/0030001 | A1 * | 2/2007 | Brunson | G01R 33/0286 324/244 |
| 2010/0275675 | A1 * | 11/2010 | Seppa | G01L 9/0041 73/24.01 |
| 2011/0140692 | A1 * | 6/2011 | Classen | B81C 99/003 324/244 |
| 2011/0192229 | A1 * | 8/2011 | Chen | G01R 33/0286 73/514.32 |
| 2012/0032283 | A1 * | 2/2012 | Frey | G01P 15/0802 257/415 |
| 2013/0096825 | A1 * | 4/2013 | Mohanty | G01C 21/165 701/472 |
| 2013/0167632 | A1 * | 7/2013 | Huang | G01R 33/0286 73/493 |
| 2013/0241546 | A1 * | 9/2013 | Fu | G01R 33/02 324/259 |
| 2014/0049256 | A1 * | 2/2014 | Smith | B81B 3/0032 324/259 |
| 2014/0076051 | A1 * | 3/2014 | Ma | G01P 15/097 73/514.29 |
| 2015/0183632 | A1 * | 7/2015 | Su | B81B 7/008 257/415 |
| 2016/0289063 | A1 * | 10/2016 | Ocak | B81B 7/0048 |

OTHER PUBLICATIONS

M. El Ghorba, N. André, S. Sobieski, J.-P. Raskin, "CMOS Compatible Out-of-Plane and In-Plane Magnetometers," Proc. IEEE Conf. on Solid State Sensors, Actuators and Microsystems, pp. 2373-2376, Jun. 2007.
M. Thompson, M. Li, and D. Horsley, "Low Power 3-Axis Lorentz Force Navigation Magnetometer," Proc. IEEE Conf. on MEMS, pp. 593-596, Jan. 2011.
M. Li, V. Rouf, M. Thompson, and D. Horsley, "Three-Axis Lorentz Force Magnetic Sensor for Electronic Compass Applications," J. Microelectromech. Syst., vol. 21, No. 4, pp. 1002-1010, Aug. 2012.
C.-I. Chang, M.-H. Tsai, Y.-C. Liu, C.-M. Sun, and W. Fang, "Development of Multi-Axis CMOS-MEMS Resonant Magnetic Sensor Using Lorentz and Electromagnetic Forces," Proc. IEEE Conf. on MEMS, pp. 193-196, Jan. 2013.
F. Nabki, T. Dusatko, S. Vengallatore, and M. El-Gamal, "LowTemperature (<300 ° C.) Low-Stress Silicon Carbide Surface Micromachining Fabrication Technology," Tech. Digest of the Hilton Head Solid-State Sensors, Actuators and Microsystems Workshop, pp. 216-219, Jun. 2008.
F. Nabki, T. Dusatko, S. Vengallatore, and M. El-Gamal, "Low Stress CMOS-Compatible Silicon Carbide Surface-Micromachining Technology—Part I: Process Development and Characterization," J. Microelectromech. Syst., vol. 20, No. 3, pp. 720-729, Jun. 2011.
F. Nabki, P. Cicek, T. Dusatko, M. El-Gamal, "Low Stress CMOS Compatible Silicon Carbide Surface-Micromachining Technology—Part II: Beam Resonators for MEMS above IC," J. Microelectromech. Syst., vol. 20, No. 3, pp. 730-744, Jun. 2011.
W.-H. Lin and Y.-P. Zhao, "Casimir Effect on the Pull-in Parameters of Nanometer Switches," Microsystem Technologies, vol. 11, No. 2-3, pp. 80-85, Feb. 2005.
ZSSC3123 cLiteTM Capacitive Sensor Signal Conditioner Datasheet, Rev. 1.61, Zentrum Mikroelektronik Dresden AG (ZMDI), Dresden, Germany, 2013.
PIC18F2455/2550/4455/4550 Datasheet, Microchip Technology Inc., Chandler, AZ, 2009.
MAT14 Matched Monolithic Quad Transistors Datasheet, Analog Devices Inc., Norwood, MA, 2010.
ARMS Series Stage User Manual, Rev. 1.01.00, Aerotech Inc., Pittsburg, PA, 2011.
A. Alfaifi, K. Allidina, F. Nabki, and M. El-Gamal, "A Low CrossSensitivity Dual-Axis Silicon-On-Insulator Accelerometer Integrated as a System in Package with Digital Output," Analog Integrated Circuits and Signal Processing, vol. 77, No. 3, pp. 345-354, 2013.

* cited by examiner

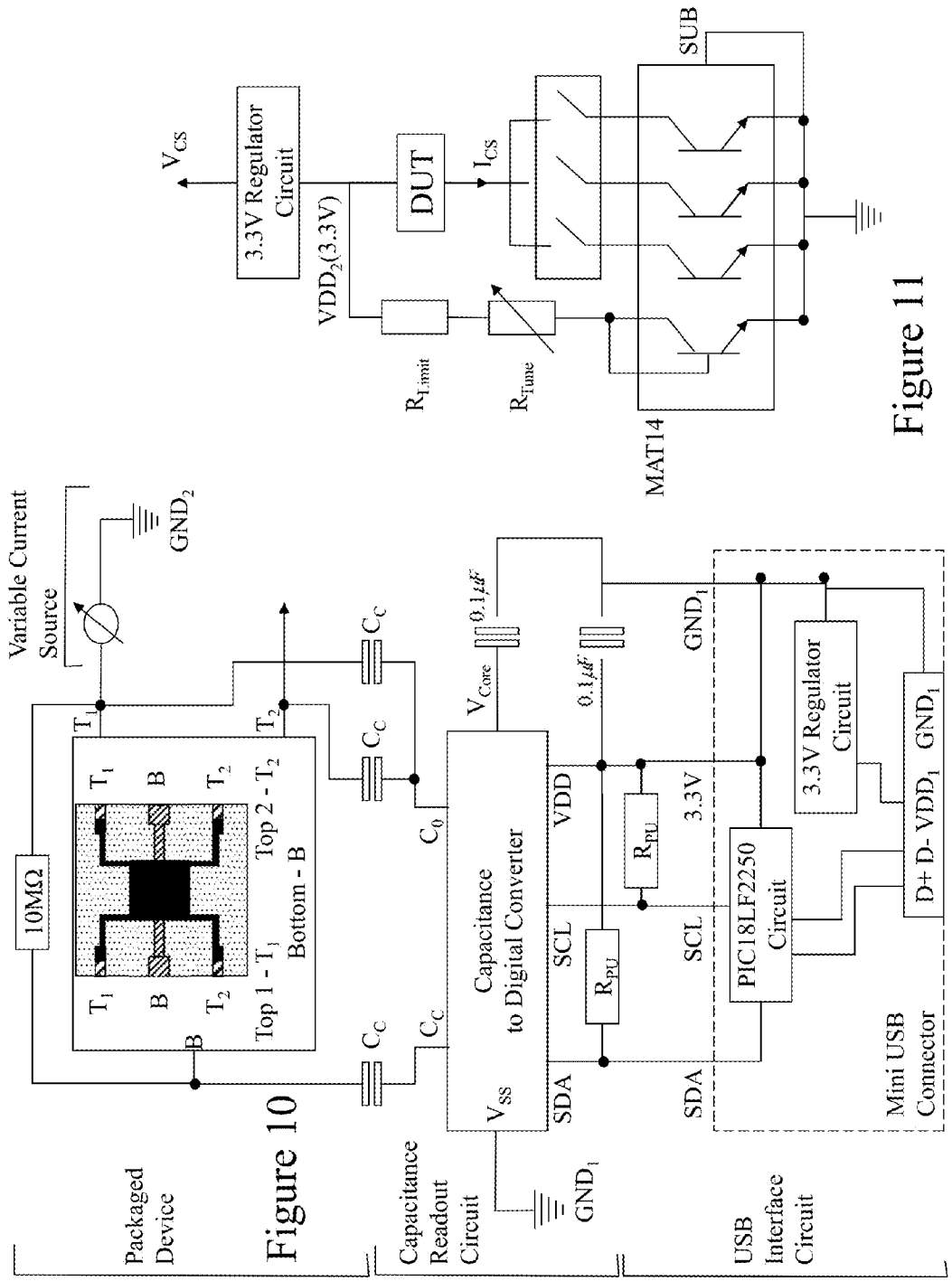

COMBINED MAGNETOMETER ACCELEROMETER MEMS DEVICES AND METHODS

CROSS-REFERENCE TO RELATED APPLICATIONS

This patent application claims the benefit of priority from U.S. Provisional Patent Application 62/080,637 filed Nov. 17, 2014 entitled "Combined Magnetometer Accelerometer MEMS Devices and Methods", the entire contents of which are incorporated herein by reference.

FIELD OF THE INVENTION

This invention relates to microelectromechanical (MEMS) devices and more particularly to providing both magnetometer and accelerometer functionality within a single active MEMS device.

BACKGROUND OF THE INVENTION

Sensors are transducers or converters that measure a physical quantity and convert it into a signal which can be read. Typically, that reading is by an electronic instrument which converts the signal to a measurement based upon the sensitivity of the sensor, its calibration data, and other corrections. Included within the many types of sensors are those relating to sound, acoustics, vibration, chemicals, humidity, pressure, fluid flow, position, displacement, force, level, temperature, proximity, and acceleration. For each type of sensor, different sensing mechanisms exist which may for example be targeted to different dynamic ranges, speed, accuracy, etc. Amongst these capacitive sensing constitutes a very important means of monitoring and accordingly, capacitive sensors have major applications in the consumer, industrial, automotive and medical fields.

However, in essentially all applications, the important considerations for selecting a capacitive sensor include, but are not limited to, accuracy, repeatability, long-term stability, ease of calibration, resistance to chemical and physical contaminants, size, packaging, integration options with other sensors and/or electronics, and cost effectiveness. It is usually desirable to miniaturize and integrate such capacitive sensing systems in order to meet the requirements of existing markets and penetrate new markets and reduce fabrication costs through batch processing. Sustainable protection from oxidation and corrosion and ruggedness are also especially critical for operation in harsh environments. In many instances, the integration of capacitive based sensors directly with their associated electronics is important in attaining packaging dimensions and costs that are compatible with very low-cost high volume markets, such as consumer electronics for example. Additionally, the ability to integrate multiple capacitive sensors within a single compact low cost system is beneficial as it reduces system footprint and overall assembly costs.

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically, MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with silicon electronics. Examples of MEMS device applications today include inkjet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions.

Silicon CMOS electronics has become the predominant technology in analog and digital integrated circuits. This is essentially because of the unparalleled benefits available from CMOS in the areas of circuit size, operating speed, energy efficiency and manufacturing costs which continue to improve from the geometric downsizing that comes with every new generation of semiconductor manufacturing processes. In respect of MEMS systems, CMOS is particularly suited as digital and analog circuits can be designed in CMOS technologies with very low power consumption. This is due, on the digital side, to the fact that CMOS digital gates dissipate power predominantly during operation and have very low static power consumption. This power consumption arising from the charging and discharging of various load capacitances within the CMOS gates, mostly gate and wire capacitance, but also transistor drain and transistor source capacitances, whenever they are switched. On the analog side, CMOS processes also offers power savings by offering viable operation with sub-1V power supplies and with µA-scale bias currents.

Amongst the many environmental parameters electrical and magnetic field (EMF) exposure has been the subject of substantial research and analysis. Health-related research around EMF has focused primarily on magnetic field exposure. However, magnetic fields are not easily sensed and accordingly today micromachined Lorentz force based magnetometers are receiving considerable attention in the sensing community, as they can be fabricated without requiring any custom magnetic materials (e.g., integrated permanent magnets in the device of Ettelt et al., "A Novel Microfabricated High Precision Vector Magnetometer" (Proc. IEEE Conf. on Sensors, pp. 2010-2013). The ability to remove magnetic materials allows for the co-fabrication of magnetometers alongside other MEMS sensors on the same chip, for augmented functionality with minimum impact on form factor. Such integration is highly attractive for consumer electronics applications, where MEMS sensors are playing an increasing role each day. In such cost-sensitive applications, exotic magnetic materials often do not justify the added costs and fabrication complexity, and limit the compatibility of magnetometers with other MEMS sensing structures and integrated circuits (ICs). Within the prior art an out-of-plane Lorentz force magnetometer and a ferromagnetic in-plane nickel magnetometer have been reported requiring high temperature fabrication steps, e.g., 800° C. In other research Lorentz force-based resonant sensors for in-plane or out-of-plane magnetic fields have been reported using silicon-on-insulator (SOI) technology. While two similar orthogonal structures could be used for 3D sensing, these devices are not suitable for post-CMOS monolithic integration. Chang et al. in "Development of Multi-Axis CMOS-MEMS Resonant Magnetic Sensor Using Lorentz and Electromagnetic Forces" (Proc. IEEE Conf. on MEMS, pp. 193-196) co-fabricated CMOS electronics and MEMS magnetometer exploiting the commercial TSMC 0.35 µm technology but this restricts the materials and inherits the constraints inherent to that semiconductor process node.

Alternatively, sensors that are amenable to above-IC integration present lower parasitics to the associated readout circuitry, resulting in an improved overall sensitivity. Furthermore, the area sharing made possible by overlaying the sensors with the electronics allows for smaller overall chip size, compared to the side-by-side co-fabrication approach. Accordingly, the inventors have established a combined Lorentz force based magnetometer and accelerometer MEMS sensor exploiting a low temperature, above-IC-compatible fabrication process. The proposed sensor exploits switching an electrical current between two perpendicular directions on the device structure to achieve a 2D in-plane magnetic field measurement. Concurrently, the device serves as a 1D accelerometer for out-of-plane acceleration, by switching the current off and by monitoring the structure's capacitive change in response to acceleration. The design can thus separate magnetic and inertial force measurements, utilizing a single compact device. The combined Lorentz force based magnetometer and accelerometer MEMS sensor supports static operation at atmospheric pressure removing the requirements for complex vacuum packaging. However, the device can also be packaged under vacuum allowing it to operate at resonance for enhanced sensitivity. The device is fabricated using a silicon carbide (SiC) surface micromachining technology established by the inventors which is fully adapted for above-IC integration on standard CMOS substrates.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to address limitations within the prior art relating to microelectromechanical (MEMS) devices and more particularly to providing both magnetometer and accelerometer functionality within a single active MEMS device.

In accordance with an embodiment of the invention there is provided a microelectromechanical (MEMS) device comprising:
a structural member;
a plurality of supports suspending the structural member above a bottom electrode; and
a plurality of top electrical contacts, each top electrical contact associated with a support; wherein
  the structural member acts as a current carrying element for a magnetometer; and
  the structural member acts as a proof mass for an accelerometer supporting concurrent use as a magnetometer and an accelerometer with the same structural MEMS element.

In accordance with an embodiment of the invention there is provided a microelectromechanical (MEMS) device providing for operation as a magnetometer and an accelerometer with the same structural MEMS element.

In accordance with an embodiment of the invention there is provided a microelectromechanical (MEMS) device comprising:
a lower electrode on a substrate having a first electrical contact; and
a diaphragm suspended above the substrate and lower electrode and supported by four beams each ending in a discrete electrical contact with a first pair of beams along a first edge of the diaphragm and a second pair of beams along a second opposite side edge of the diaphragm; wherein
the first and second pairs of beams allow the diaphragm to move relative to the substrate during at least one of:
  a first mode of operation absent applying a current to any of the four beams wherein capacitance variations between the diaphragm and lower electrode are determined arising from acceleration of the MEMS device perpendicular to the diaphragm;
  a second mode of operation comprising applying a current to the first pair of beams wherein capacitance variations between the diaphragm and lower electrode are determined arising from at least one of acceleration of the MEMS device perpendicular to the diaphragm and a magnetic field in the plane of the diaphragm in first direction; and
  a third mode of operation comprising applying a current to a first beam of the first pair of beams and a second beam of the second pair of beams wherein first beam of the first pair of beams and the second beam of the second pair of beams are disposed on the same side of the diaphragm and capacitance variations between the diaphragm and lower electrode are determined arising from at least one of acceleration of the MEMS device perpendicular to the diaphragm and a magnetic field in the plane of the diaphragm in a second direction.

In accordance with an embodiment of the invention there is provided a microelectromechanical (MEMS) device supporting use as a magnetometer and an accelerometer with the same structural MEMS element; wherein
the manufacturing process for the MEMS device limits the maximum temperature of a CMOS electronic circuit formed within a substrate upon which the MEMS device is manufactured to one of 200° C., 250° C., 300° C., and 350° C.; and
the structural MEMS element is formed from a material selected from the group comprising silicon, silicon dioxide, silicon nitride, silicon oxynitride, carbon, aluminum oxide, silicon carbide and a ceramic.

In accordance with an embodiment of the invention there is provided a microelectromechanical (MEMS) device supporting use as a magnetometer and an accelerometer with the same structural MEMS element wherein the structural MEMS element is formed from a material selected from the group comprising silicon, silicon dioxide, silicon nitride, silicon oxynitride, carbon, aluminum oxide, silicon carbide and a ceramic.

In accordance with an embodiment of the invention there is provided a microelectromechanical (MEMS) device supporting use as a magnetometer and an accelerometer with the same structural MEMS element fabricated directly onto at least one of a Complementary Metal Oxide Semiconductor (CMOS) electronic circuit and a substrate with integrated CMOS electronic circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 10 depicts a simplified schematic of the test setup used for the magnetic characterization of a magnetometer/accelerometer MEMS device according to an embodiment of the invention;

FIG. 11 depicts a simplified schematic of the variable current source circuit employed in testing a magnetometer/accelerometer MEMS device according to an embodiment of the invention

DETAILED DESCRIPTION

The present invention is directed to microelectromechanical (MEMS) devices and more particularly to providing both magnetometer and accelerometer functionality within a single active MEMS device.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

A. Design and Operation

A.1 Combined Magnetometer Accelerometer Design Principles

The principle of operation for a Lorentz force magnetometer can be explained by considering that within a magnetic field B there is a wire of length l which is carrying a current I. As a result the wire will be affected by a Lorentz force ($F_{Lorentz}$) which is orthogonal to both the wire and the magnetic field as given by Equation (1). Accordingly, if we are able to measure the displacement of the wire caused by the force, while knowing both the current and length, then the magnetic field can be inferred.

$$\vec{F}_{Lorentz}=i(\vec{l}\times\vec{B}) \quad (1)$$

Accordingly, if a MEMS device is fabricated wherein an element carrying current is within a magnetic field, it will be subject to the Lorentz force and exhibit displacement. If that current carrying element is then part of a displacement sensor, such as one operating through measuring capacitance change for example, then the capacitance change can be converted to a displacement and then knowing the properties of the current carrying element and current flowing we can derive the magnetic field. In this manner a Lorentz force magnetometer can be implemented employing MEMS manufacturing techniques (e.g., surface micromachining) to provide a current carrying element as part of a capacitive based displacement sensor. However, if the current carrying member which is suspended to allow its movement is now the proof mass within a MEMS accelerometer device then the MEMS can provide both magnetometer and accelerometer measurements as will become evident from the description below of embodiments of the invention and their operating method.

Figure 1B:
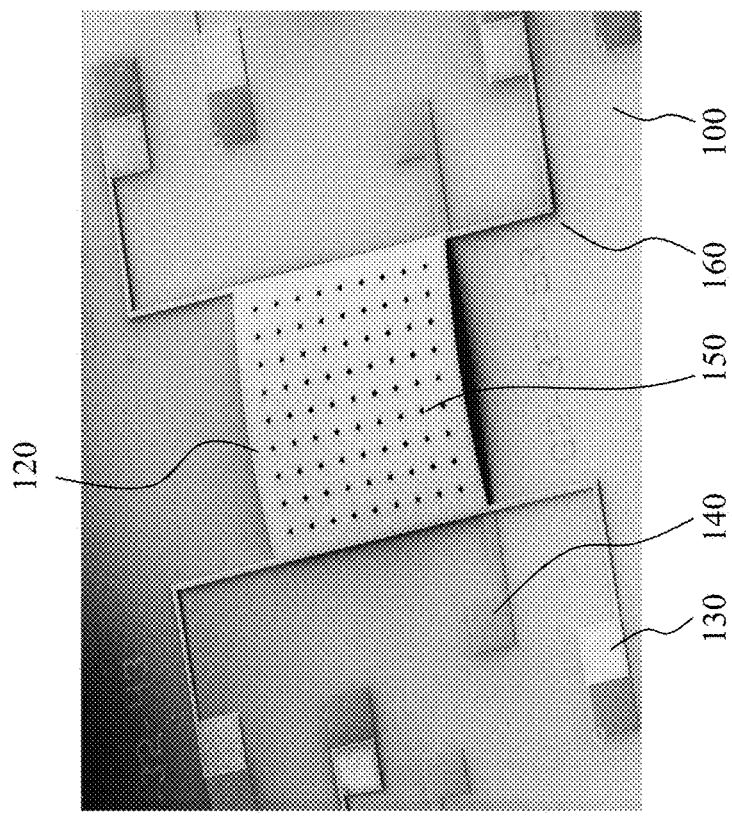
FIGS. 1A-1C respectively depict a SEM image of a concurrent magnetometer/accelerometer microelectromechanical (MEMS) device according to an embodiment of the invention.
Figure 1A:
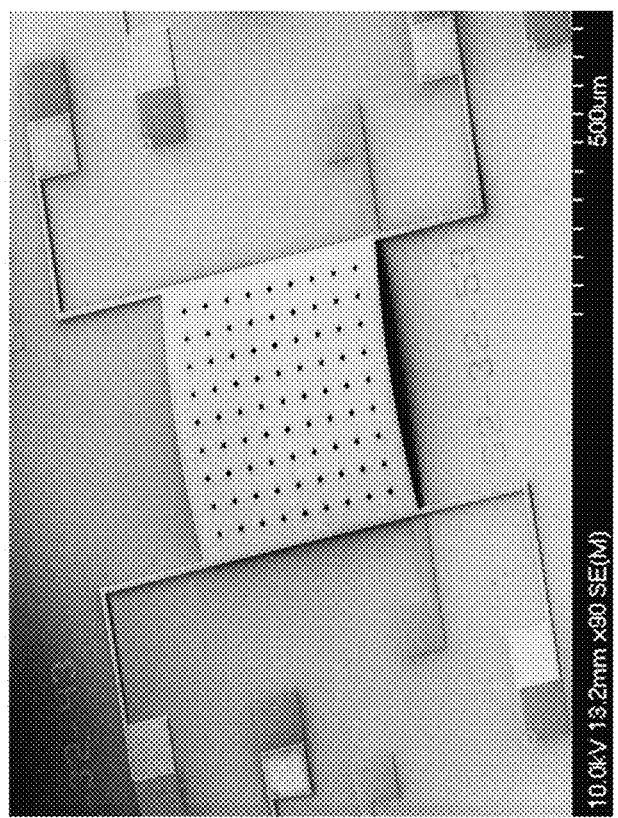
Figure 1C:
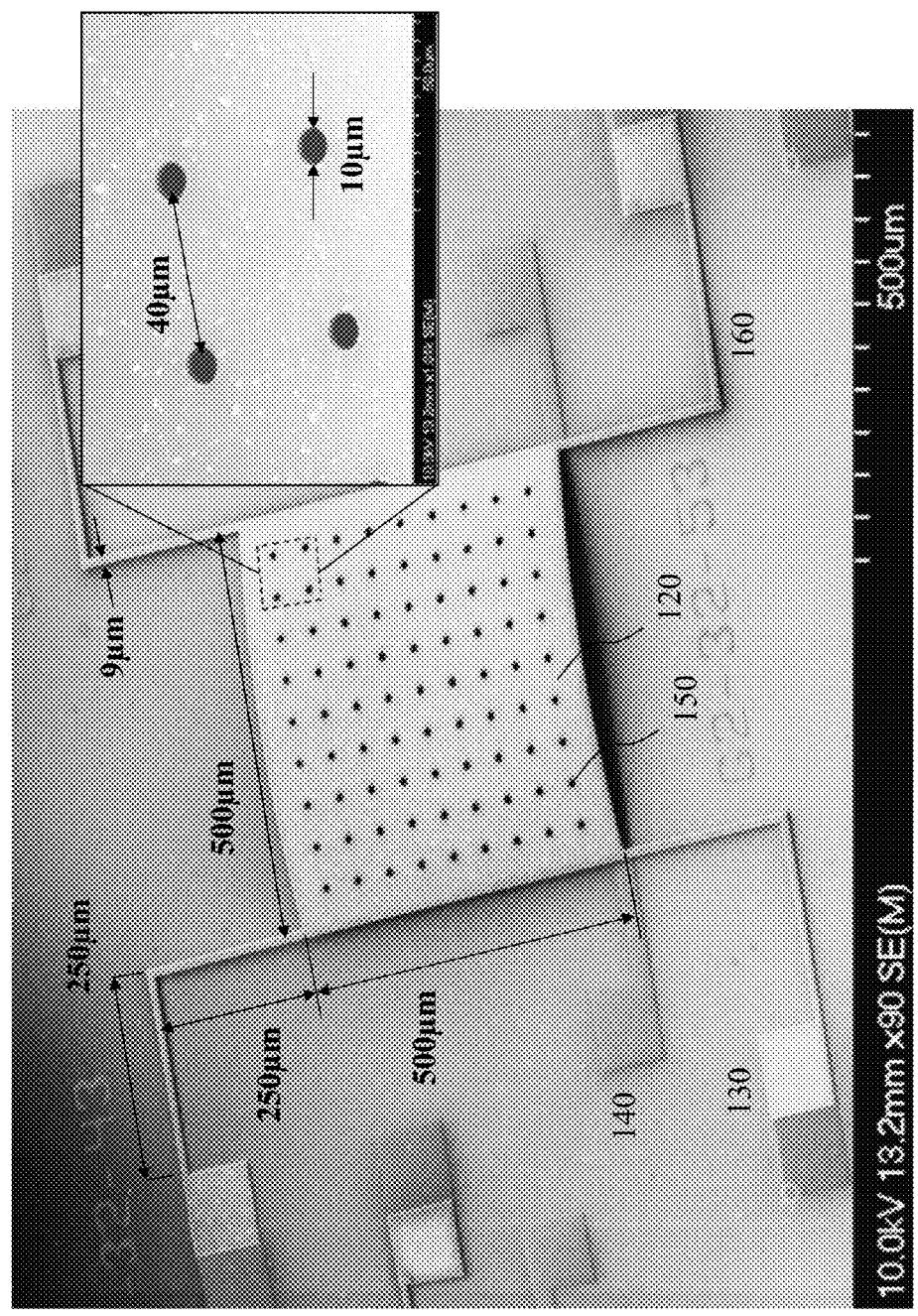

Referring to FIGS. 1A to 1C there are depicted SEM micrographs of a fabricated combined magnetometer/accelerometer (MAGACC) MEMS device according to an embodiment of the invention. Bowing is apparent in the device due to its relatively large area, and the residual stresses present in the film stack. The MAGACC MEMS sensor is composed of four elements upon a substrate 100:

(1) a 2 μm-thick 500 μm square suspended structure 120 acting as the current carrying element for magnetometer operation and concurrently serving as the proof mass for the accelerometer;

(2) a metallic layer underlying the suspended structure 120 in order to serve as a low resistivity path for the current, thus helping to reduce electrical noise.

(3) four 250 μm-long and 9 μm-wide suspension beams 160, anchored from their ends 130, holding the proof mass and allowing for its free motion and electrically interconnected via the metallic layer beneath the structural layer 120, routing through the suspension beams to connections pads 130;

(4) a sensing electrode underneath the suspended structure 120 used for the capacitive detection of the out-of-plane motion resulting from Lorentz or inertial forces and electrically interconnected via bottom electrical connection pads 140; and The suspended structure 120 being 500 μm square also incorporates release holes 150 to improve the release process of the suspended structure 120 from the substrate 100 during manufacturing. The beam dimensions are chosen to adjust the stiffness of the supports in order to provide adequate sensitivity and ensure the structural integrity of the device. The spring constant k of a simple cantilever beam is given by Equation (2) where E is the Young's Modulus of the beam material (e.g. amorphous SiC within the implemented embodiments of the invention for which results are presented below), w is the beam width, t is the structure thickness, and l is the beam length. A summary of the device design parameters is given in Table I.

$$k_{SimpleBeam} = E \frac{wt^3}{4l^3} \quad (2)$$

TABLE 1

Design Parameters for Proof-of-Principle MAGACC MEMS Devices

| Parameter | Value |
|---|---|
| Proof Mass | 500 μm × 500 μm |
| Structure Thickness | 2 μm |
| Suspension Dimensions | 250 μm × 9 μm |
| Capacitance Gap | 0.5 μm |
| Spring Constant ($k_{eq}$) | 1.07 N/m |
| Resonance Frequency | 4.03 kHz |

A.2 Combined Magnetometer Accelerometer Operating Principles

In order to achieve both magnetometer and accelerometer measurements from a MAGACC MEMS device according to embodiments of the invention the inventors have established a sensing cycle which is divided into three successive phases. The first and second phases of this cycle are depicted in FIGS. 2A and 2B respectively.

Figures 2A, 2B:
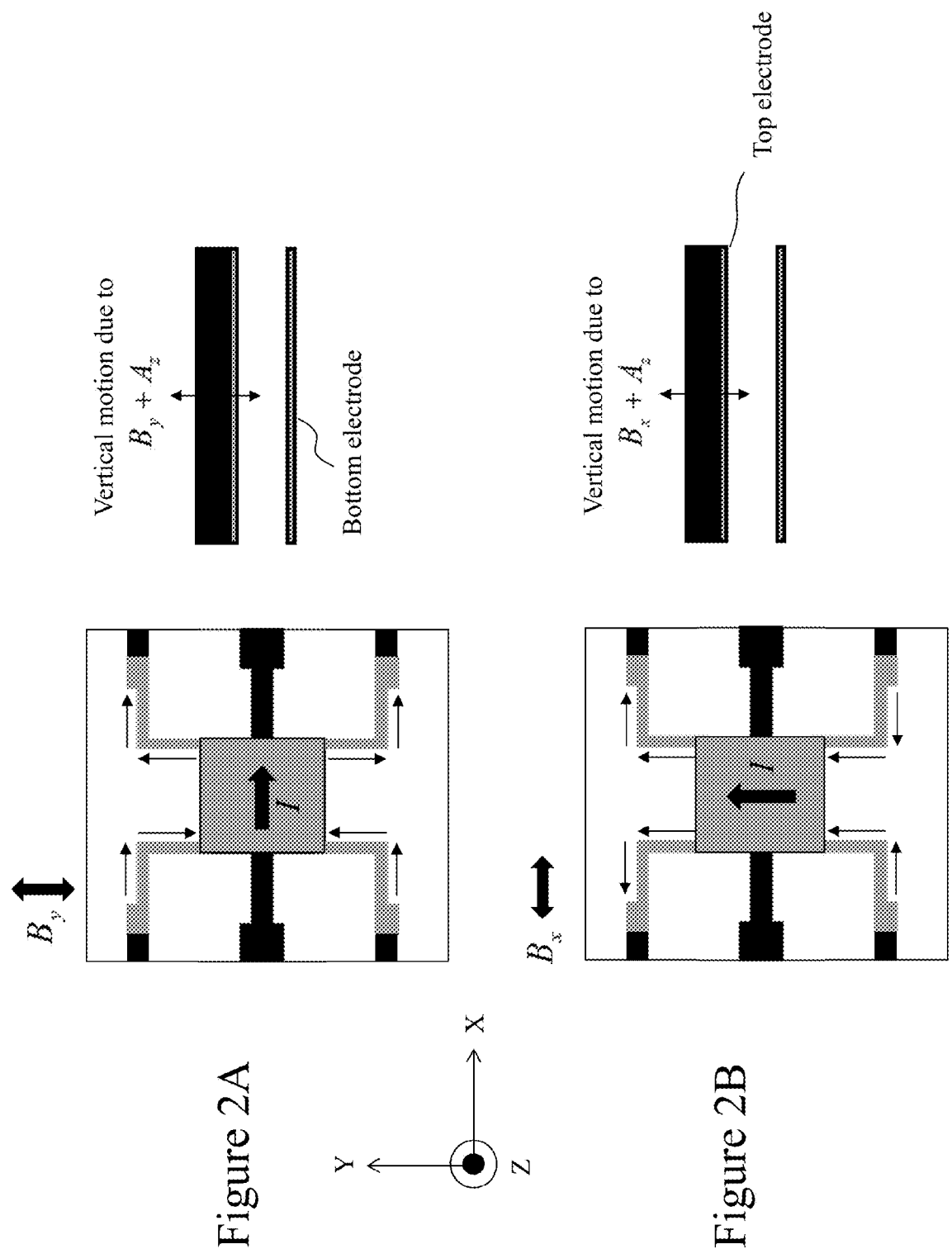
FIGS. 2A and 2B depict the first two phases of the sensing cycle showing the current direction together with a side cross-section view illustrating the device displacement network environment within which embodiments of the invention may be employed.

Phase 1:

The current is driven along the x-axis of the MAGACC MEMS, depicted as being from left to right in FIG. 2A, causing the resulting Lorentz force to induce a displacement along the z-axis, due to any magnetic field in the y-axis. This displacement is detected capacitively by the sense electrode, and can be used to infer the y-axis component of the magnetic field. This measurement is also sensitive to external z-axis inertial force.

Phase 2:

The current is directed along the y-axis, from bottom to top. The resulting Lorentz force then causes a displacement along the z-axis, due to any magnetic field along the x-axis. Capacitive detection at the sense electrode is used to determine the x-axis component of the magnetic field. This measurement is also sensitive to external z-axis inertial force.

Phase 3:

The current is switched off so that the motion due to the z axis inertial force is detected and used to cancel out its effect on the magnetic field measurements in phases 1 and 2, achieving a high accuracy combined two-dimensional (2D) magnetometer and one dimensional (1D) accelerometer.

In order to increase the number of operation axes of the MAGACC MEMS device, lateral electrodes can be added at the perimeter of the proof mass, as suggested by the inventors within U.S. Pat. No. 8,658,452 and WIPO Patent Application WO/2010/003,228 both entitled "Low Temperature Ceramic Microelectromechanical Structures," in order to enable in-plane motion detection and achieve a three-dimensional (3D) magnetometer and 3D accelerometer MAGACC MEMS.

A.3 Casimir Force

The Casimir force is an attractive force that acts between two close parallel uncharged conducting plates and arises due to quantum vacuum fluctuations of the electromagnetic field. As the MAGACC MEMS device presented here has a large electrode area and a relatively small gap, this force must be considered. In addition to the Casimir force, the suspended top plate of the device is affected by several other forces, namely the gravitational force, the applied Lorentz and inertial forces, and the suspension spring forces as evident from Equation (3).

$$F_{total} = F_{Casimir} + F_{gravitational} + F_{Lorentz} + F_{vertical} + F_{spring} \quad (3)$$

$$F_{Casimir} = \frac{\pi hc w_{PM} L_{PM}}{480(d-z)^4} \quad (4)$$

The Casimir force is proportional to the electrode area and is inversely proportional to the fourth power of the distance between the two electrodes. It is given by Equation (4) where h is Planck's constant, c is the speed of light in vacuum, $w_{PM}$ is the width of the proof mass (top electrode), and $L_{PM}$ is its length, d is the nominal capacitive gap between the electrodes, and z is the displacement of the top electrode. The gravitational force related to the weight of the structure is given by Equation (5) where $\rho_{SiC}$ is the density of the SiC structural material, and g is Earth's gravitational acceleration. The balancing spring force is given by Equation (6) where $k_{eq}$ is the equivalent spring constant of the structure.

$$F_{gravitational} = \rho_{SiC} g w_{PM} L_{PM} t \quad (5)$$

$$F_{spring} = k_{eq} z \quad (6)$$

Figure 3:
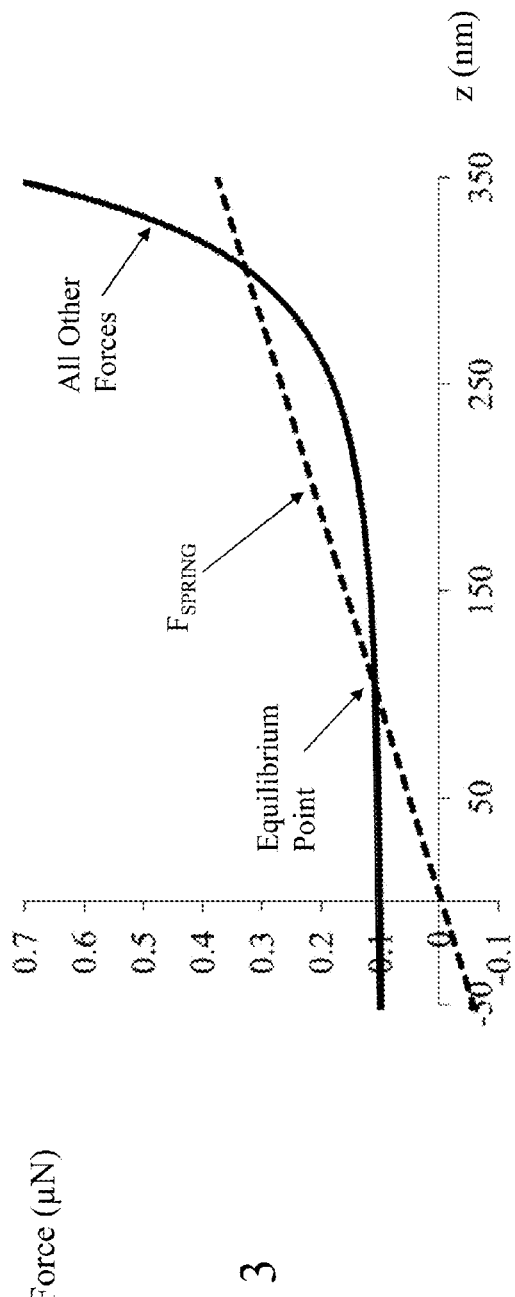
FIG. 3 depicts forces affecting the proof mass structure within a magnetometer/accelerometer MEMS device according to an embodiment of the invention versus vertical displacement.

At equilibrium, the resultant force must be zero, i.e., $F_{total}=0$, as illustrated in FIG. 3, where all the forces are plotted along with that of the restorative spring force. Furthermore, a necessary condition is that the first derivative of total force be negative at the point of equilibrium, i.e. $dF_{total}/dz<0$, resulting in the condition defined by Equation (7).

$$\frac{dF_{total}}{dz} = \frac{\pi hcw_{PM}L_{PM}}{120(d-z)^5} - k_{eq} < 0 \quad (7)$$

Figure 4:
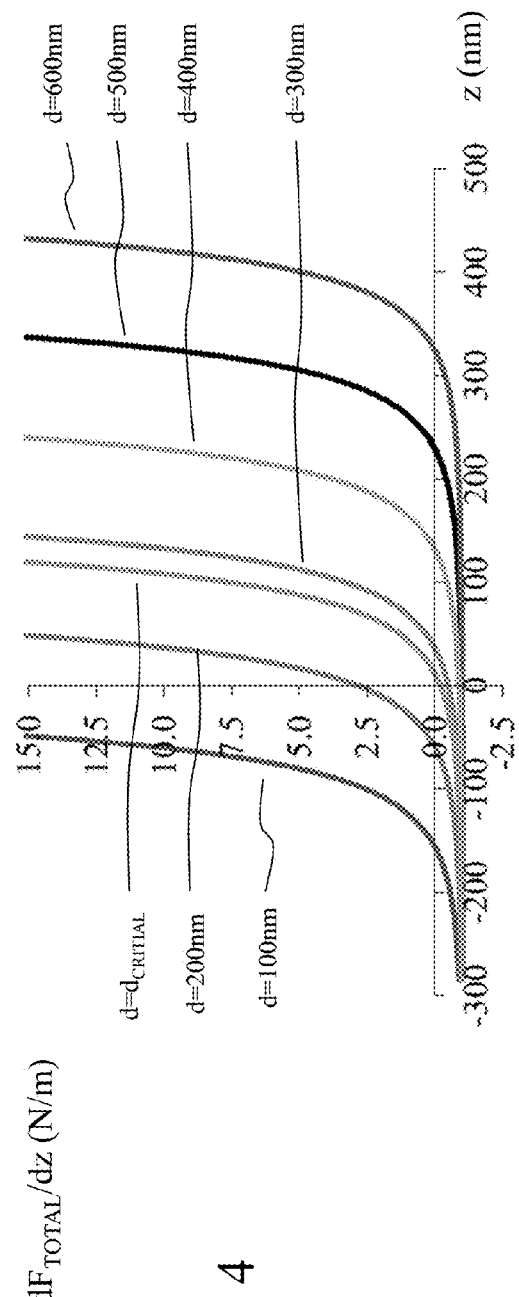
FIG. 4 depicts the first derivative of the total force versus displacement for different values of the inter-electrode gap of a magnetometer/accelerometer MEMS device according to an embodiment of the invention.

Referring to FIG. 4 there is depicted a plot of $dF_{total}/dz<0$ for different values of the gap between the electrodes (d). For small values of d, $dF_{total}/dz<0$ is always positive for all positive displacement (z) values. This means that the top electrode would always be pulled-in by the Casimir force directly after release such that there is no stable equilibrium state. As d increases, however, beyond a certain value, $d_{Critical}$, a stable equilibrium range where $dF_{total}/dz<0$ is met is reached for positive z. This equilibrium ensures that the structure will not collapse as a result of Casimir force after release. In order to calculate $d_{Critical}$, the Casimir force for small values of z can be neglected as it is very small, and will otherwise complicate the solution due to its $1/(d-z)^4$ dependence. For a critically stable condition without pull-in after release, the spring force should balance the weight, as given by Equation (8) where $z_{P1}$ is the displacement in this critically stable situation.

$$k_{eq}z_{P1} = \rho_{SiC}gw_{PM}L_{PM}t \quad (8)$$

$$d > d_{critical} = \sqrt[5]{\frac{\pi hcw_{PM}L_{PM}}{120k_{eq}}} + \frac{\rho_{SiC}gw_{PM}L_{PM}t}{k_{eq}} \quad (9)$$

$$z_{max} = d - \sqrt[5]{\frac{\pi hcw_{PM}L_{PM}}{120k_{eq}}} \quad (10)$$

By combining Equations (7) and (8) then $d_{critical}$ can be calculated using Equation (9) resulting in $d_{critical}$=275 nm for the design of the proof mass within the proof-of-principle devices fabricated by the inventors according to an embodiment of the invention. The maximum possible displacement of the structure before pull-in collapse due to the Casimir force is expressed by Equation (10).

Accordingly, a sacrificial layer thickness, i.e. the gap between the electrodes, of 500 nm was selected in order to ensure structural integrity of the device after release, and to allow sufficient displacement before a pull-in collapse occurs. The derivative of the total force versus placement for this selected gap size is shown in FIG. 4, yielding a stable equilibrium region for displacements below 239 nm. This allowable displacement range allows for a good dynamic range of the device. It would also be evident that at all times during operation of the MAGACC MEMS devices according to embodiments of the invention the electrical potential difference between electrodes must be kept well below the electrostatic pull-in voltage given by Equation (11) where $\varepsilon_0$ is the free space permittivity. The pull-in voltage value is calculated from Equation (11) to be ~130 mV. Accordingly, careful attention needs to be given to this issue during the sensing circuit design, in order to avoid electrostatic pull-in and collapsing of the structure, as discussed below. Notably, this calculated pull-in value is expected to be below the actual value, because of the bowing observed in FIGS. 1A to 1C.

B. Simulation Results

Figure 5:
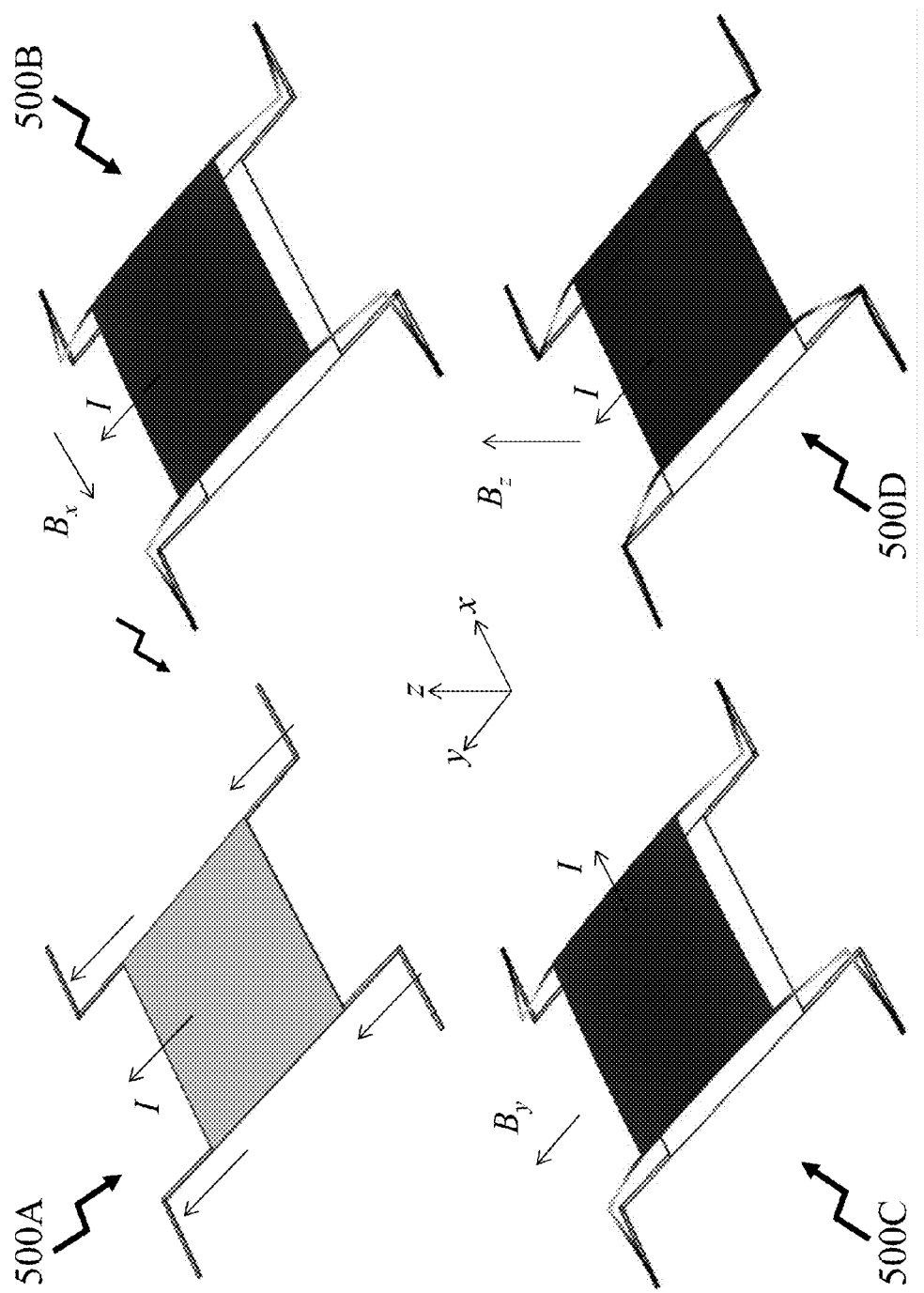
FIG. 5 depicts FEM simulations showing the structure displacement as a result of a force along the z-axis for a magnetometer/accelerometer MEMS device according to an embodiment of the invention under different excitations.

Finite-element simulations illustrating the displacement of the MAGACC MEMS according to an embodiment of the invention is depicted in FIG. 5 with first to fourth images 500A to 500D respectively. First image 500A depicts the basic structure modelled comprising the square proof mass supported at each corner. Second image 500B depicts the displacement of the proof mass in the z-axis as a result of magnetic field in the x-axis, $B_X$, detected with single ended capacitive sensing from the electrode structure below the proof mass. Third image 500C depicts the displacement of the proof mass in the z-axis as a result of magnetic field in the y-axis, $B_y$, with switching of the current direction, detected with single ended capacitive sensing from the electrode structure below the proof mass. Fourth image 500D depicts the displacement of the proof mass in the x-axis as a result of magnetic field in the z-axis, $B_Z$, detected with differential capacitive sensing from the electrode structures next to the structure.

Figure 6A:
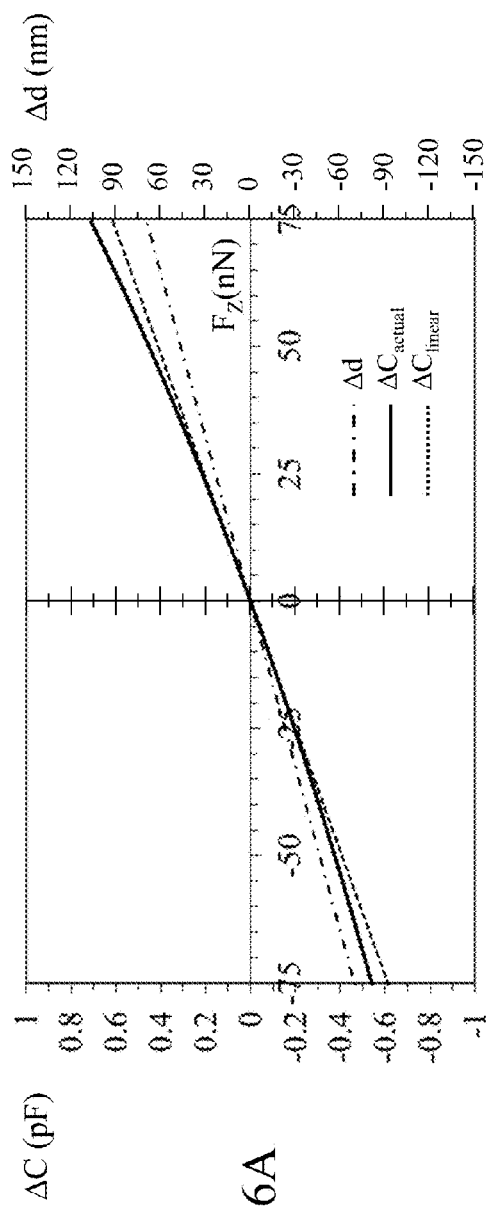
FIG. 6A depicts the change in capacitance and displacement versus external force applied for a magnetometer/accelerometer MEMS device according to an embodiment of the invention.

Now referring to FIG. 6A there is depicted the simulation results for the displacement $\Delta d$ relative to $F_z$, the external force applied along the z-axis. In order to calculate $\Delta C_{actual}$, the resulting change in capacitance for the device, a parallel plate capacitor approximation was employed by the inventors neglecting the fringing fields as given by Equation (12) where A is the area of the capacitor plate and d is the nominal gap size, defined by the thickness of the sacrificial layer employed in the manufacturing of the device, e.g. polyimide. Based upon the Taylor series expansion, a linear approximation for the change in capacitance can be made for $\Delta d \ll d$ as given by Equation (13).

$$\Delta C_{actual} = C_{new} - C_{nom} = \frac{\varepsilon_0 A}{d - \Delta d} - \frac{\varepsilon_0 A}{d} \quad (12)$$

$$\Delta C_{linear} = \frac{\varepsilon_0 A}{d}\left(\left(1 - \frac{\Delta d}{d}\right)^{-1} - 1\right) \approx \frac{\varepsilon_0 A}{d^2}\Delta d \quad (13)$$

$$\% \text{ Error} = \left|\frac{\Delta C_{actual} - \Delta C_{linear}}{\Delta C_{linear}}\right| \times 100 \quad (14)$$

Figure 6B:
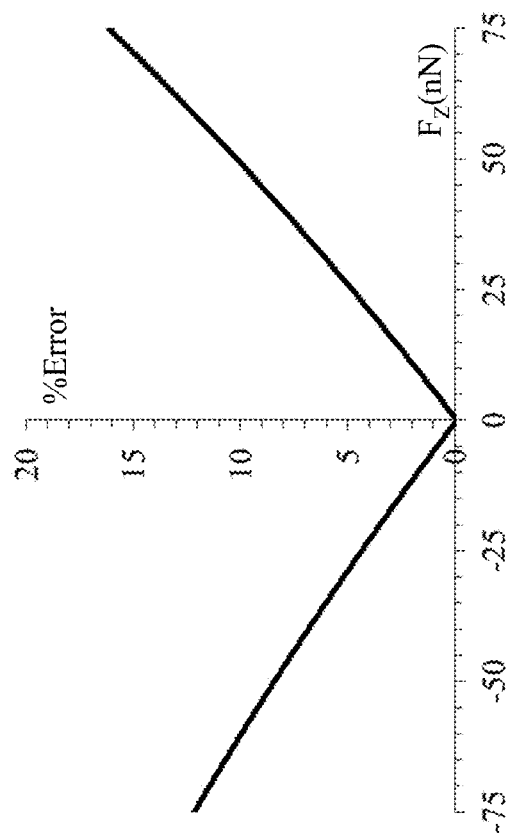
FIG. 6B depicts the percentage error of capacitance linear approximation versus external force applied for a magnetometer/accelerometer MEMS device according to an embodiment of the invention.

FIG. 6A depicts the sensor response calculated using Equation (12) as well as the linear approximation given by Equation (13). Accordingly, the spring constant $k_{eq}$ of the structure can be calculated to be of 1.07N/m, which corresponds to a capacitance sensitivity of 8.24 μF/N. This translates to a magnetic field sensitivity of 8.24 nF/A/T for a structure length of 1 mm in which current flows to generate the Lorentz force, as deduced from Equation (1), and an acceleration sensitivity of 121 fF/g, as deduced from Equation (5). The percentage error between the actual and linear capacitance changes is shown in FIG. 6B and is expressed in Equation (14).

The actual change in capacitance coincides well with the linear approximation for small displacements, but starts to differ for larger motion. By limiting the worst-case linearity error to 10%, the dynamic range of the device is found to be ±50 nN. This value corresponds either to a detected magnetic field of ±50 mT with a driving current of 1 mA, or to a detected acceleration of ±3.4 g. Furthermore, in order to determine the maximum shock the device can survive before collapsing, step input acceleration is considered. The damping ratio (ξ) is calculated to be ~0.0167 from the measured value of the quality factor (Q), see results below. Accordingly, the system's step response experiences an overshoot percentage ($M_p$) of 95%, according to Equation (15). By limiting the maximum displacement overshoot to 239 nm ($z_{max}$ before Casimir pull-in, as calculated above), then determining the displacement step input yielded by the overshoot percentage, and calculating the required acceleration to generate this step, the maximum shock the device can survive is calculated to be ±9 g.

$$M_p = 100 \cdot e^{-\pi \zeta / \sqrt{1-\zeta^2}} \quad (15)$$

C. Fabrication Process

Figure 7A:
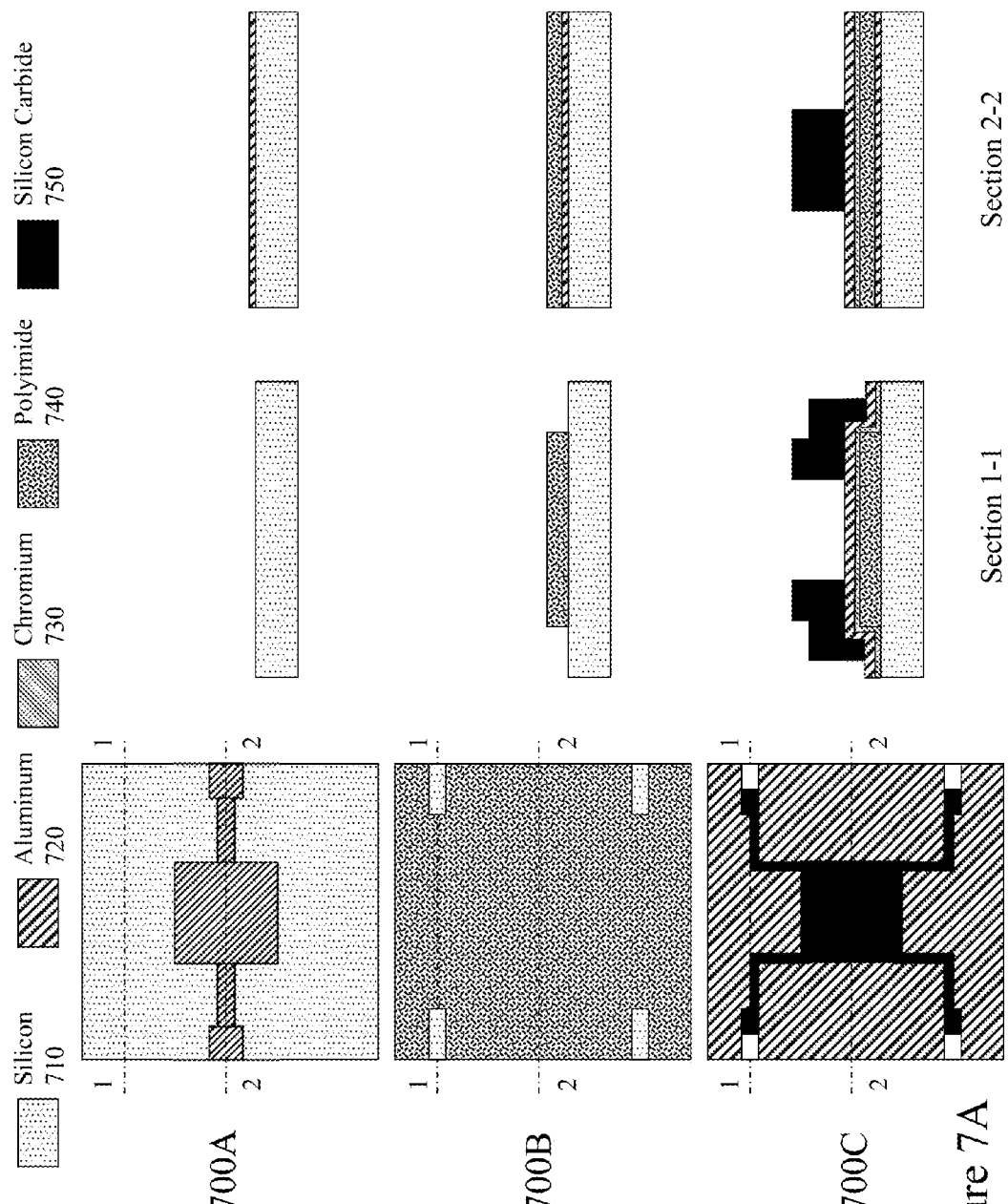
FIGS. 7A and 7B respectively depict a simplified manufacturing process sequence for a magnetometer/accelerometer MEMS device according to an embodiment of the invention exploiting a silicon carbide structure proof mass.
Figure 7B:
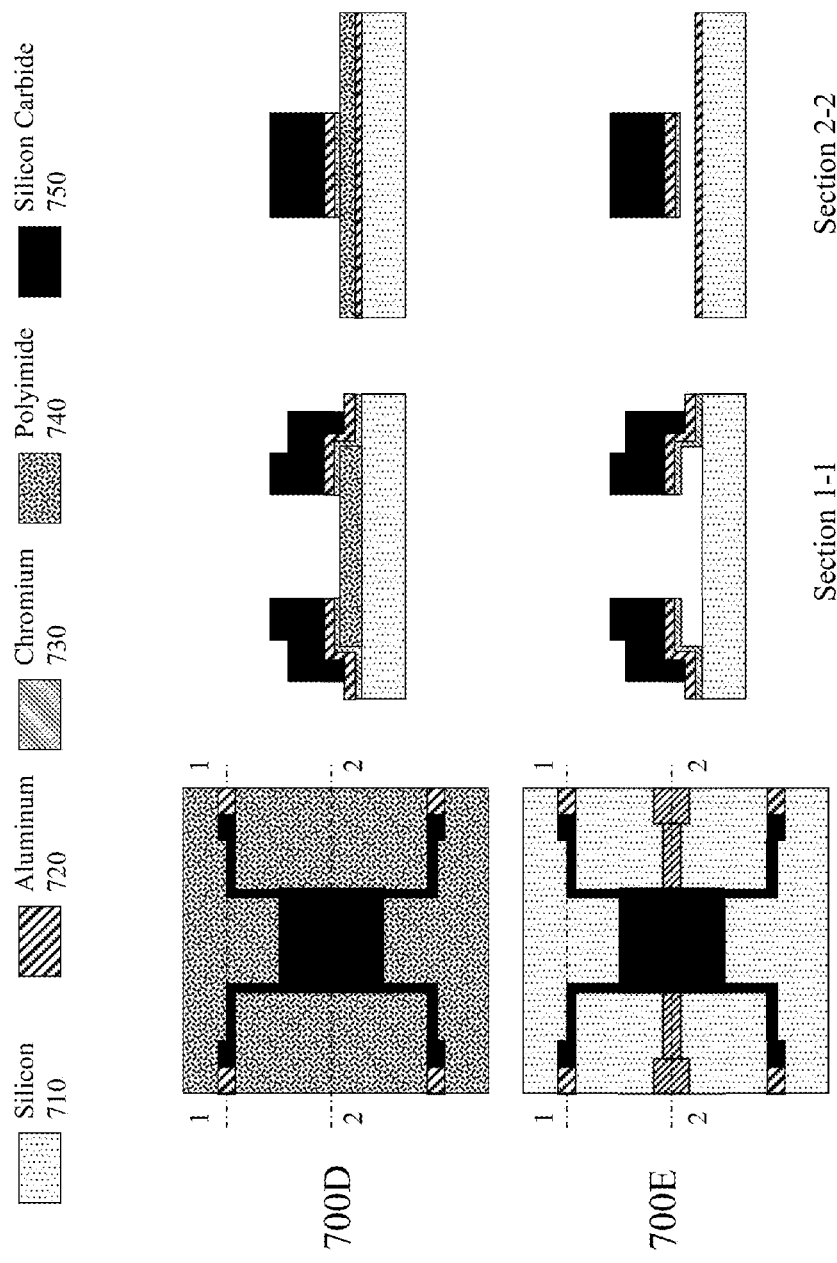

Referring to FIGS. 7A and 7B respectively there is depicted an exemplary fabrication process according to an embodiment of the invention with respect to manufacturing a MAGACC MEMS device according to an embodiment of the invention. As depicted the process comprises first to fifth steps 700A to 700E wherein each is depicted in plan view and first and second sections, Section 1-1 and Section 2-2, respectively. A silicon 710 substrate covered with a layer of thermal oxide is used for this prototype although the process is designed to be fully compatible with monolithic integration on standard CMOS substrates. First, a 200 nm layer of aluminum 720 is deposited onto the silicon 710 substrate by DC sputtering. The aluminum 720 is then patterned and wet etched using phosphoric-acetic-nitric acid (PAN) etchant to form the bottom electrode and the pads as depicted in first step 700A. Next in second step 700B a 0.5 µm sacrificial polyimide 740 layer is spin coated and oven cured at 200° C. to form the vertical gaps for the sense capacitor. An oxygen reactive ion etch is then employed to pattern the polyimide to allow for the eventual anchoring of the structural supports to the substrate, evident as the polyimide free regions in 700B. Subsequently, the structural stack is deposited in third step 700C comprising:
 a) a 2 µm amorphous silicon carbide 750 (SiC) layer, which is the main structural layer;
 b) a 200 nm aluminum 720 layer to form the low resistance path for the current, reducing the electrical noise; and
 c) a 20 nm layer of chromium 730 acting as an etch stop layer during the second aluminum 720 etch.

The stack is covered by a 600 nm chromium 730 layer to act as a hard mask while etching the SiC 750 layer, this step not being depicted. The deposition of the four layers is performed using DC sputtering, after which the chromium 730 hard mask is patterned and wet etched. The SiC 750 is then dry etched using nitrogen trifluoride (NF3) reactive ion etching, stopping onto the underlying aluminum 720 layer. Subsequently, the chromium 730 hard mask is wet stripped yielding the structure as depicted in third image 700C in FIG. 7A. Next the underlying aluminum 720 and chromium 730 layers are patterned using wet etching, as shown in fourth image 700D in FIG. 7B. During this step, the chromium 730 layer acts as an etch stop, protecting the exposed regions of the first aluminum 720 layer from the etch of the second aluminum 720 layer. Finally, the process is completed by dry release of the sacrificial polyimide using oxygen plasma, as shown in fifth image 700E in FIG. 7B. A dry release mitigates the risk of stiction, compared to the more common wet release methods. Release holes with 10 µm diameter and 40 µm spacing are incorporated within the suspended structure to facilitate the release process.

It would be evident that other manufacturing process sequences may be employed without departing from the scope of the invention in providing discrete MAGACC MEMS devices or MAGACC MEMS devices integrated atop CMOS drive and control electronics. Examples of some such processes can be found within Nabki et al. in "Low-Temperature (<300° C.) Low-Stress Silicon Carbide Surface Micromachining Fabrication Technology" (Tech. Digest of the Hilton Head Solid-State Sensors, Actuators and Microsystems Workshop, pp. 216-219), Nabki et al. in "Low Stress CMOS-Compatible Silicon Carbide Surface-Micromachining Technology—Part I: Process Development and Characterization" (J. Microelectromech. Syst., vol. 20, no. 3, pp. 720-729), and Nabki et al. in "Low Stress CMOS-Compatible Silicon Carbide Surface-Micromachining Technology—Part II: Beam Resonators for MEMS above IC" (J. Microelectromech. Syst., vol. 20, no. 3, pp. 730-744) as well as patent applications by the inventors including U.S. Pat. Nos. 8,658,452 and 8,071,411 both entitled "Low Temperature Ceramic Microelectromechanical Structures," U.S. Pat. No. 8,409,901 entitled "Low Temperature Wafer Level Processing for MEMS Devices," U.S. Pat. No. 8,697,545 entitled "Direct Contact Heat Control of Micro-Structures" and US 2014/0,230,547 entitled "Microelectromechanical Bulk Acoustic Wave Devices and Methods." Accordingly, it would be evident that processing sequences having maximum processing temperatures that are at least one of 200° C., 250° C., 300° C., and 350° C. are possible.

Further, such processing sequences allow for ceramic structures that are metallized upon their sidewalls increasing the performance of capacitive sensing elements disposed adjacent the proof mass to extend the concept to 3D. Whilst the embodiments of the invention have been described with respect to a silicon carbide for the proof mass and supporting arms that other structural layers may be employed including, but not limited to, silicon, silicon dioxide, silicon nitride, silicon oxynitride, carbon, aluminum oxide, and other ceramics.

Beneficially manufacturing processes according to embodiments supported by the processes within the prior art of the inventors support lower side metallization of the proof mass, e.g. the diaphragm, as well as sidewall and top side metallization.

Beneficially manufacturing processes according to embodiments supported by the processes within the prior art of the inventors support encapsulation of the MAGACC MEMS device with materials including, but not limited to, Parylene-C and silicon carbide.

D. Measurement Results

D.1 Resonance Characteristics

Figure 8:
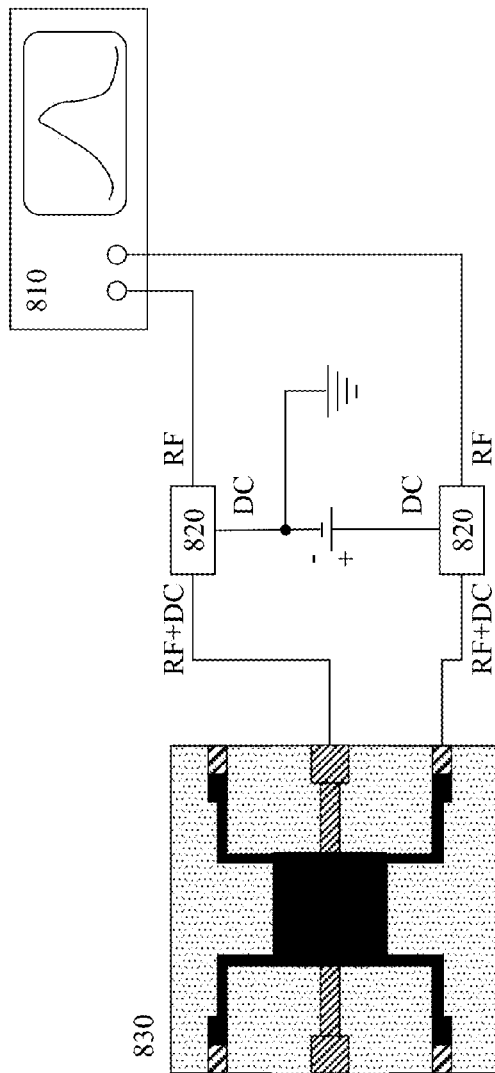
FIG. 8 depicts a simplified schematic of the test setup used for resonance characterization of a magnetometer/accelerometer MEMS device according to an embodiment of the invention.
Figure 9:
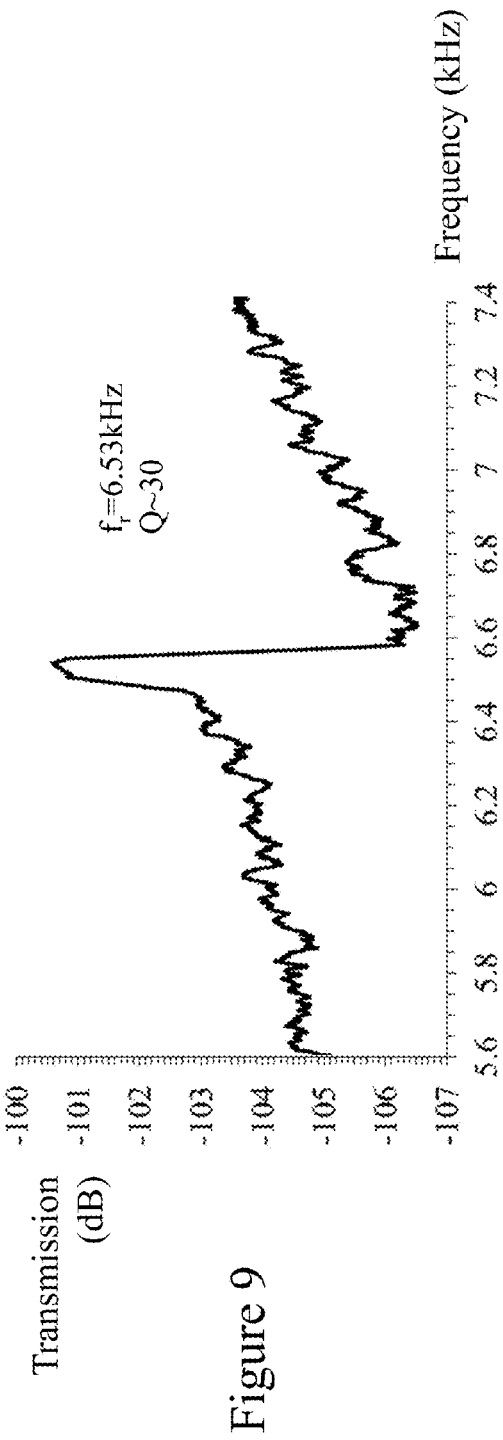
FIG. 9 depicts the measured resonance characteristics of a magnetometer/accelerometer MEMS device according to an embodiment of the invention under 10 mTorr vacuum.

The resonance characteristics of the fabricated devices are measured under vacuum using the test setup depicted in the schematic in FIG. 8. Bias tees 820 were used to decouple the high frequency measurement signals from the DC signals, and apply the DC voltages to the device, which are necessary for electrostatic actuation. Measurement results for devices with 200 µm support beam length are shown in FIG. 9 exhibiting a resonance frequency ($f_r$) of 6.53 kHz and a quality factor (Q) of approximately 30 under 10 mTorr vacuum level. This Q value is calculated based on the 3-dB bandwidth inferred in FIG. 9. It should be noted that the actual measured peak is slightly lower than 3 dB. However, this method is used to ascertain a worst case value. Alternatively, considering the resonance curve as symmetric and calculating the bandwidth using the right side of the curve only, a Q of 125 is obtained. Finite-element Eigen frequency simulation indicates a resonance frequency of 4.03 kHz. The difference between the simulated and measured values can most likely be attributed to the residual stress also at play in the bowing of the structure.

D.2 Magnetic Field Response

The magnetic field response of the fabricated devices was characterized using a variable electromagnet and discrete electronics. The schematic of the test setup used is shown in FIG. 10, where DC current is generated by a variable current source and flows through the top structure of the device from pad T1 to pad T2. This current serves to generate a Lorentz force when the device is subjected to an in-plane magnetic field normal to the current. The resulting capacitance change between the top (T) and bottom (B) electrodes of the device is monitored and used to acquire the magnetic field. A commercial capacitance to digital converter chip was configured to measure the capacitance of the device relative to an internal reference capacitor. This chip outputs a 1 MHz 1.8V square wave excitation signal for the capacitance measurement. As the bowing of the fabricated MAGACC MEMS structure exhibited had widened the gap to ~5 μm, the corresponding electrostatic pull-in voltage is increased to ~4.2V. Accordingly, electrostatic pull-in will not occur during sensing. Coupling capacitors ($C_C$=22 μF) were employed to couple the AC signal between the device and the capacitance readout chip, as well as prevent any DC current leakage from the current source circuit to the chip. A 10MΩ resistor was connected between the top and bottom electrodes of the device to make sure that they stay at the same DC potential in order to avoid any electrostatic force between them. The capacitance readout chip communicates the digital words for the measured capacitance through an I2C interface to a USB interface circuit using a pair of pull-up resistors ($R_{PU}$=2.2 kΩ). A Microchip PIC18 LF2550 microcontroller was employed to receive the digital data from the capacitance readout circuit through the I2C interface and then transmit it to the host PC via USB. The microcontroller is also used for configuration of the capacitance readout chip.

The schematic of the current source circuit is shown in FIG. 11 and employs an Analog Devices MAT14 matched monolithic quad transistor chip. One transistor is connected in a diode configuration with two resistors ($R_{Limit}$ and $R_{Tune}$) at the collector, generating the reference current. $R_{Limit}$ serves as a current-limiting resistor to protect the chip by ensuring that the current does not exceed the maximum current rating for the minimum value of the tuning resistor $R_{True}$. $R_{Limit}$ is set to 200Ω, limiting the current to a maximum of 14.5 mA, well below the rated maximum. A 2MΩ trimmer variable resistor is used for $R_{Tune}$, due to its large number of turns, enabling fine current tuning, with a range from 1.4 μA to 14.5 mA. The remaining three transistors in the chip are connected in a basic current mirror configuration. A DIP switch is used to select the number of transistors driving the output current, thus tripling the tuning range. The capacitive readout and interface circuits are powered through the 5V USB supply from the host PC, while the current source circuit is powered through a separate 4.5V battery pack feeding a 3.3V regulator. The grounds are also kept separate as illustrated on the schematics in order to avoid any crosstalk or feed-through between the different sections of the circuit.

Figure 12:
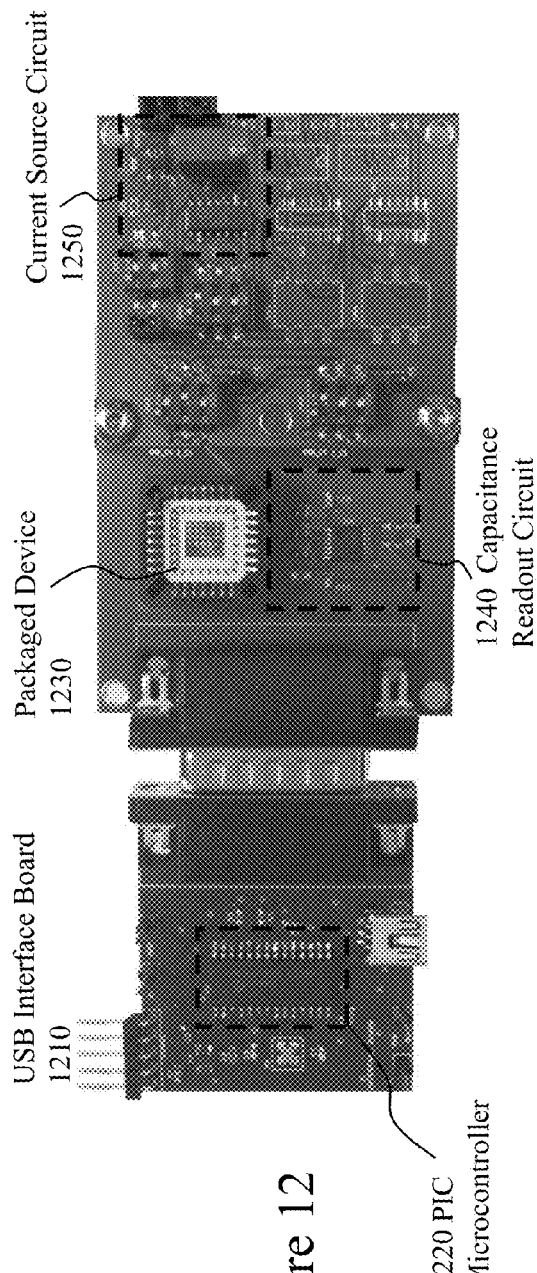
FIG. 12 depicts a photograph of the printed circuit boards used in the testing a magnetometer/accelerometer MEMS device according to an embodiment of the invention.
Figure 13:
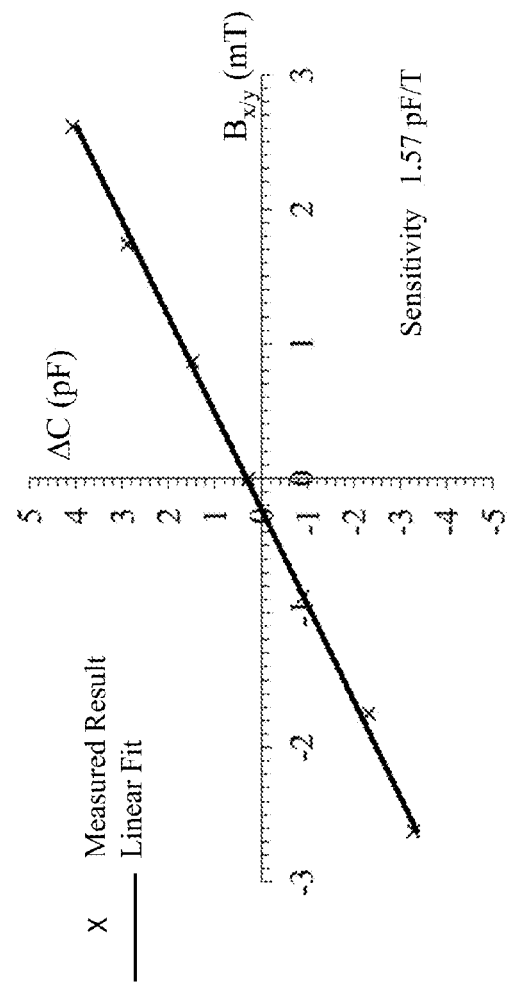
FIG. 13 depicts the measured device response to magnetic field (Bx/y), shown along with a linear fit, for a magnetometer/accelerometer MEMS device according to an embodiment of the invention.

A photograph of the printed circuit boards used in the testing is shown in FIG. 12 illustrating the different functional sections of the USB interface board 1210, PIC microcontroller 1220, MAGACC MEMS device 1230, capacitance readout circuit 1240, and current source circuit 1250. The measured magnetic field response of the device is presented in FIG. 13 wherein it is evident that the MAGACC MEMS device according to an embodiment of the invention exhibits a magnetic field sensitivity of 1.57 pF/T under static operation at a 10 mA current. The measured response shows a non-linearity of less than 6% for the whole ±3 mT measurement range, where the non-linear error is calculated using Equation (16). The measured non-linear error is slightly higher than the simulation results due to the non-linearity of the readout circuitry.

$$\% \text{ Error}_{Meas} = \left| \frac{\text{Measured Result} - \text{LinearFit}}{\text{LinearFit}} \right| \times 100 \quad (16)$$

D.3 Acceleration Response

Figure 14:
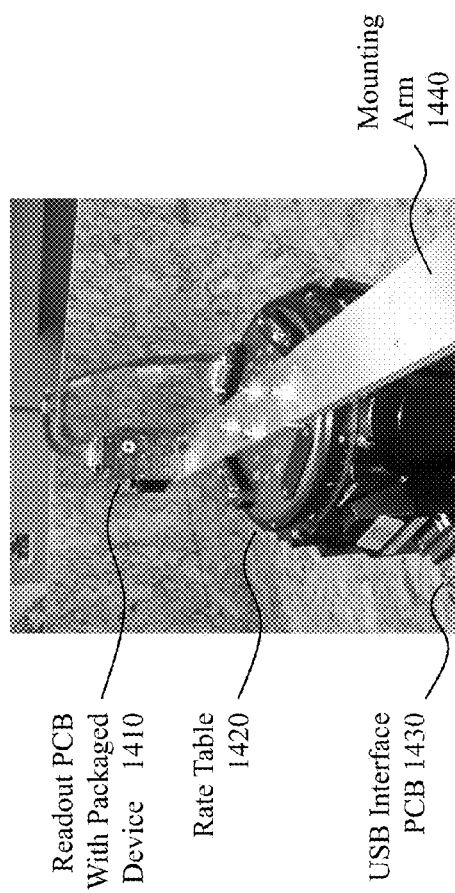
FIG. 14 depicts a photograph of the test setup used for acceleration response characterization of a magnetometer/accelerometer MEMS device according to an embodiment of the invention.

The inertial response of the fabricated devices is characterized by the same test circuitry used for magnetic field response, but with the current source circuit switched off. A picture of the test setup used is shown in FIG. 14 wherein an Aerotech ARMS-200 rate table 1420 was employed for the test, where the packaged device with capacitive readout circuit 1410 was mounted vertically using a right angle mount on the mounting arm 1440 at a distance r from the rate table 1440 center. The USB interface 1430 was connected to the rate table 1440 allowing measurements to be taken and downloaded to the test PC such that the digital capacitance data was transmitted to the USB interface 1430 microcontroller circuit through the I2C interface via a 15 pin D-SUB cable and the rate table slip rings, which maintain the electrical connectivity throughout rotation.

Figure 15:
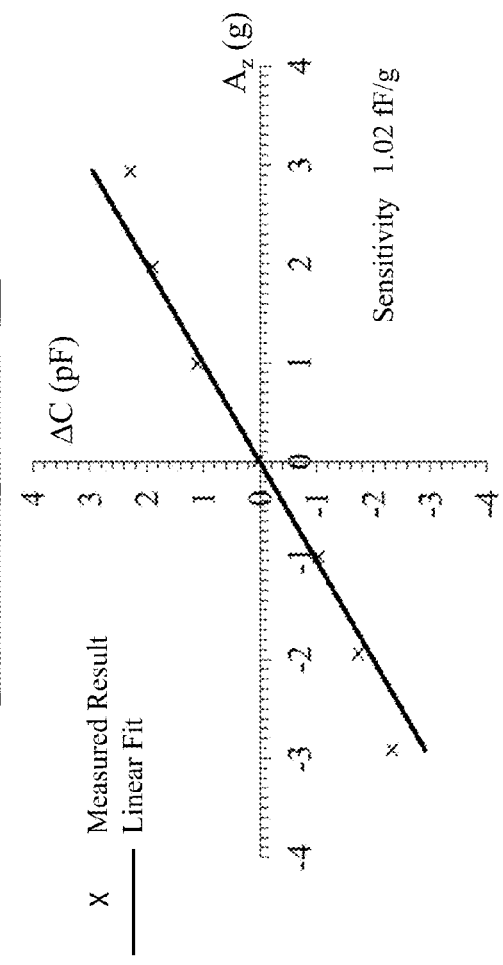
FIG. 15 depicts the measured device response to out-of-plane acceleration, shown along with a linear fit, for a magnetometer/accelerometer MEMS device according to an embodiment of the invention.

The centrifugal acceleration generated by rate table 1440 rotation is utilized to measure the rate response of the device. The rate table 1440 angular speed, ω, is varied to generate the different acceleration steps for the test as given by Equation (17) for the centrifugal acceleration, $A_C$, where m is the proof mass of the MAGACC MEMS device. The measured acceleration response of the device is depicted in FIG. 15 wherein it can be seen that the MAGACC MEMS sensor exhibits an acceleration sensitivity of 1.02 fF/g for static operation, with a non-linear error less than 10% in the range of ±2 g.

$$A_C = mr\omega^2 \quad (17)$$

E. Analysis

Referring to Table 2 there are presented results for the prototype MAGACC MEMS device against published magnetometer devices within the prior art. The different units used to report the sensitivities are a result of the different readout schemes utilized. Piezoresistive readout is used in Prior Art [1] and [2], while insufficient information is provided in Prior Art [3] and [4] to extract the capacitance change.

TABLE 2

Comparison between MAGACC MEMS According to Embodiment of the Invention with Prior Art Devices

| | Axis | Sensitivity | Dynamic Range | Linearity Non-Linearity | Resistance (Ω) | Current (μA) | Power (μW) | Area (mm²) |
|---|---|---|---|---|---|---|---|---|
| [1] | z | 164 mV/T | N/A | N/A | N/A | N/A | 10 | N/A |
| | x/y | 1.82 V/T | | | | | | |

TABLE 2-continued

Comparison between MAGACC MEMS According to Embodiment of the Invention with Prior Art Devices

|  | Axis | Sensitivity | Linearity | | Resistance ($\Omega$) | Current ($\mu A$) | Power ($\mu W$) | Area ($mm^2$) |
|---|---|---|---|---|---|---|---|---|
|  |  |  | Dynamic Range | Non-Linearity |  |  |  |  |
| [2] |  | 0.15 V/T | N/A | N/A | N/A | 10,000-50,000 | N/A | N/A |
| [3] | z | 12.98 V/T | Results | 1% | 5900 | 400 | 460 | 0.2 × 1.0 |
|  | x/y | 0.78 V/T | up to |  |  | 200 | 120 | MEMS |
|  |  |  | 0.44 mT |  |  |  |  |  |
| [4] | x | 0.13 V/T | Results | 2.27% | N/A | ~4000 | N/A | 1.8 × 1.5 |
|  | y | 0.14 V/T | up to | 3.27% |  |  |  | MEMS + |
|  | z | 1.54 V/T | 1.2 mT | 2.24% |  |  |  | IC |
| This Work | $B_{x,y}$ |  | Simulation |  | 20 | Static Operation |  | 1 × 1 |
|  |  | 82 pF/T | ±50 mT | 10% | (metallic | 10,000 | 2,000 | MEMS |
|  |  |  | ±5 mT | 1% | path) |  |  |  |
|  |  |  | Measurement |  |  | Resonant Operation |  |  |
|  |  | 1.57 pF/T | ±3 mT | 6% |  | 330(*) | 1(*) |  |
|  | $A_z$ |  | Simulation |  |  | 0(*) | 0(*) |  |
|  |  | 121 fF/g | ±3.4 g | 10% |  |  |  |  |
|  |  |  | Measurement |  |  |  |  |  |
|  |  | 1.02 fF/g | ±2 g | 10% |  |  |  |  |

[1] Ettelt et al., "A Novel Microfabricated High Precision Vector Magnetometer" (Proc. IEEE Conf. on Sensors, pp. 2010-2013). Employs permanent magnets.
[2] El Ghorba et al., "CMOS Compatible Out-of-Plane and In-Plane Magnetometers" (Proc. IEEE Conf. on Solid-State Sensors, Actuators and Microsystems, pp. 2373-2376). Utilizes nickel and high temperature (800° C.) processing steps.
[3] Li et al., "Three-Axis Lorentz Force Magnetic Sensor for Electronic Compass Applications" (J. Microelectromech. Syst., Vol. 21, pp. 1002-1010). Has chip level vacuum seal (~1 mBar) and exploits Silicon-on-Insulator (SOI) technology.
[4] Chang et al., "Development of Multi-Axis CMOS-MEMS Resonant Magnetic Sensor Using Lorentz and Electromagnetic Forces" (Proc. IEEE Conf. on MEMS, pp. 193-196). Exploits commercial TSMC 0.35 µm technology and exploits 2 perpendicular structures to achieve 3D measurements.

It is evident from the comparisons above between the measurement results for prototype MAGACC MEMS devices according to embodiments of the invention yield sensitivities that are lower than the simulated results. This is attributed to the bowing of the proof mass within the MAGACC MEMS structure, as clearly evident in FIGS. 1A to 1C. This bowing causes an increase of the effective gap between the electrodes of the capacitor by a factor of ~10 and consequently reduces the capacitance variation and sensitivity by a factor of ~100. The bowing can be reduced by optimizing the device and suspension dimensions together with further tuning of the stress profile within the material stack. Another cause for the sensitivity reduction is the interconnection parasitics between the MAGACC MEMS device and the readout circuitry, as discrete components were used for the measurements. Fabricating the sensor directly above a CMOS ASIC, which is made possible by the fabrication process described above according to an embodiment of the invention, should allow for significant sensitivity improvements by eliminating these parasitics and allowing drive and measurement circuits to be closely associated with the MAGACC MEMS device. Alternatively, wire bonding the device and the interface circuit within the same package could be used to reduce noise and parasitics as is known in the prior art. The metallic track below the structure leads to a low resistive path for the current (~20Ω), which results in reduced power dissipation and electrical noise reduction. Measurements were performed at a 10 mA current, which corresponds to 2 mW power dissipation. However, these values can be lowered, whilst maintaining good sensitivity, by reducing the bowing, and parasitics, as discussed. These can also be significantly improved by using resonant operation. Based on the static operation measurements and a resonant mode with Q-factor of 30 (measured), the current required to keep the same sensitivity level will be reduced to ~330 µA, and the average power consumption of the device is expected to be ~1 µW.

Within the description above a combined magnetometer/accelerometer design based upon the Lorentz force, where an electrical current is switched between two orthogonal directions on the device structure to achieve a 2D in-plane magnetic field measurement has been presented where the device can concurrently serve as a 1D accelerometer for out-of-plane acceleration, when the current is switched off. Accordingly, through a phased measurement process the device and its associated control and readout electronics would provide for separate magnetic and inertial force measurements from a single device and achieving high accuracy. Beneficially, the combined magnetometer/accelerometer design supports static operation at atmospheric pressure, precluding requirements for costly vacuum packaging. However, the combined magnetometer/accelerometer design can also operate at resonance under vacuum for enhanced sensitivity and power reduction. The combined magnetometer/accelerometer design device is presented as exploiting a low temperature silicon carbide (SiC) surface micromachining technology which is fully adapted for above-IC integration on standard CMOS substrates. However, it would be evident that other manufacturing processes and MEMS materials may be employed to provide combined magnetometer/accelerometer design devices either for above-CMOS integration or as discrete devices.

Figure 16A:
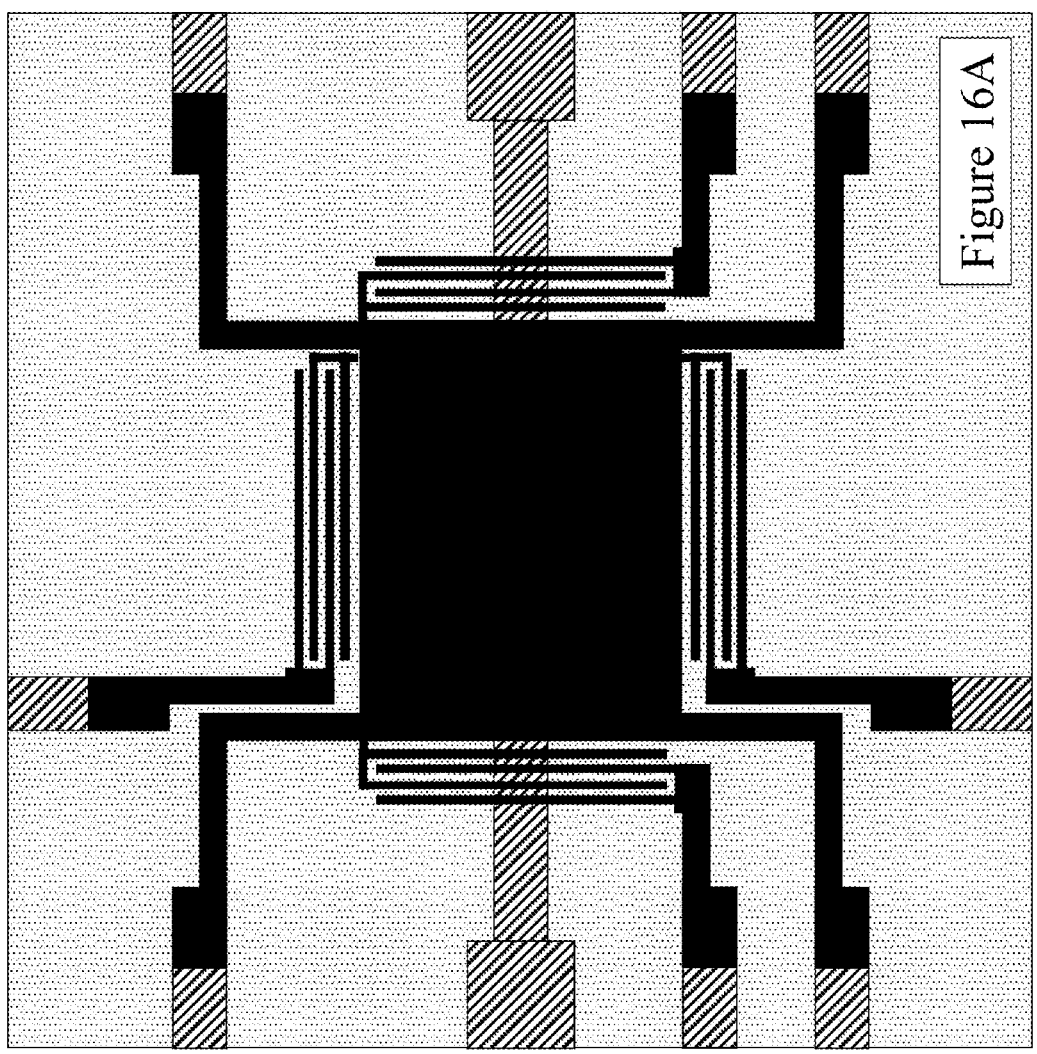
FIGS. 16A and 16B depict the addition of capacitive displacement elements on the edges of the proof mass of the magnetometer/accelerometer MEMS according to an embodiment of the invention for 3D magnetometer and accelerometer measurements.
Figure 16B:
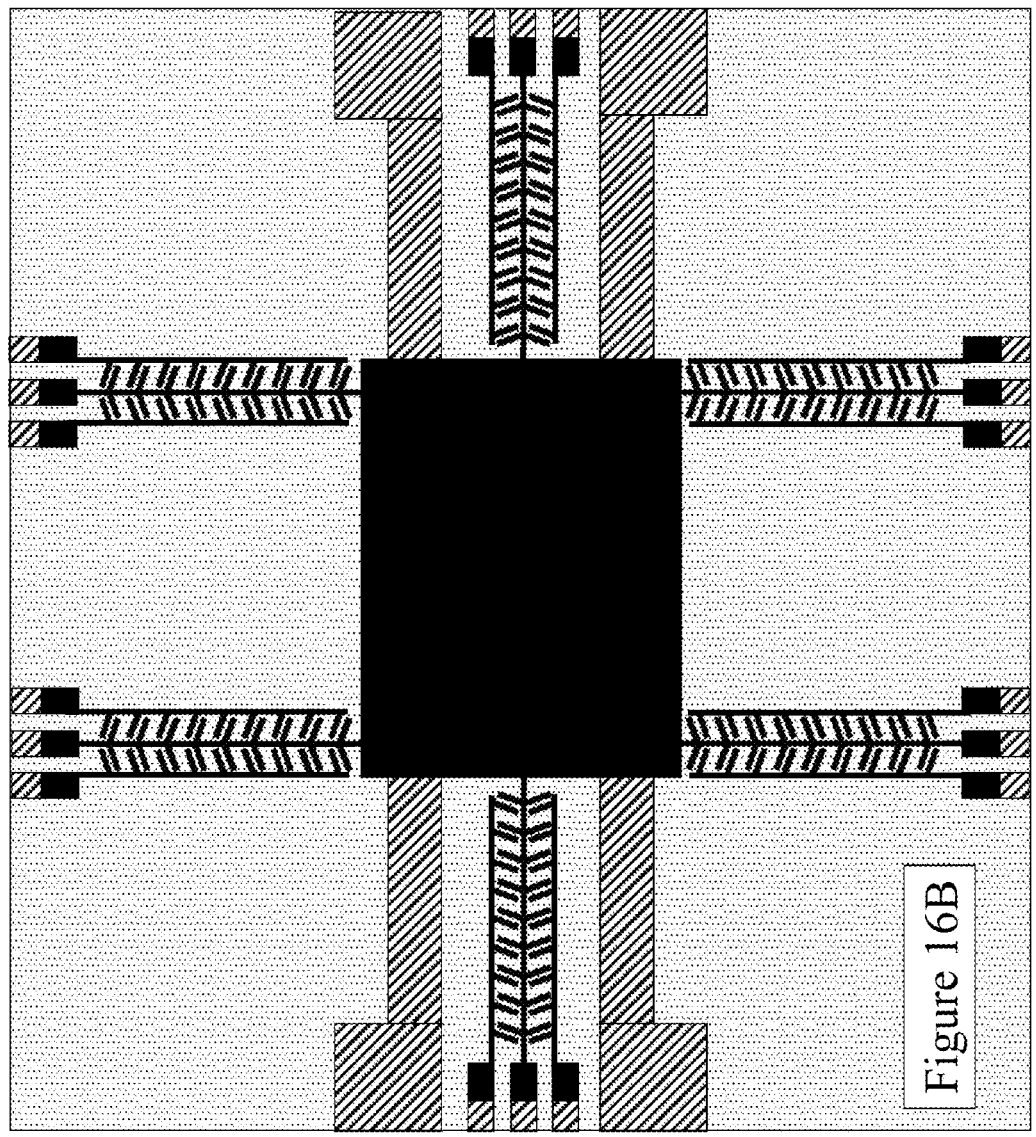

Further, adjustments to the design to include additional lateral electrodes around the perimeter of the proof mass allow the number of axes to be increased partially or fully to full 3D magnetometer and 3D accelerometer designs. Such a concept is depicted in FIG. 16A wherein adjacent each edge of the proof mass are disposed capacitive based displacement sensors for determining via capacitance variations the lateral movement of the proof mass. A variant of this is presented in FIG. 16B wherein the supporting beams of the proof mass have now been re-designed as interdigitated capacitive structures whilst additional interdigitated capacitive structures are disposed on the other edge.

Figure 17:
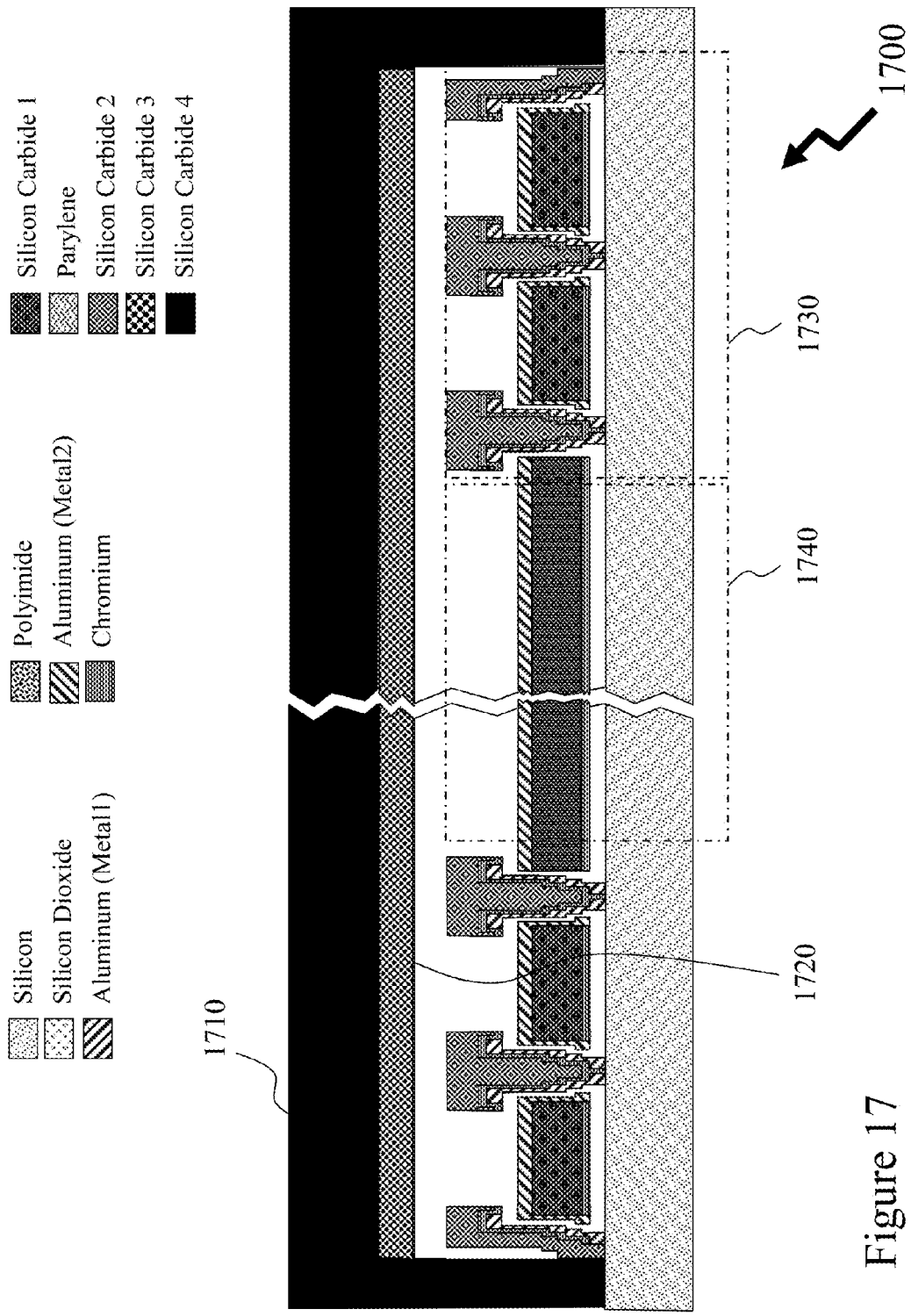
FIG. 17 depicts the encapsulation of a magnetometer/accelerometer MEMS according to an embodiment of the invention according to a low temperature manufacturing process exploiting silicon carbide capping.

Now referring to FIG. 17 there is depicted a MAGACC MEMS 1700 according to an embodiment of the invention. As depicted the MAGACC MEMS 1700 has been manufactured with a low temperature manufacturing process with a silicon carbide (Silicon Carbide 1) structural member forming the proof mass 1740 but now with upper, lower, and sidewall metallizations. The Silicon Carbide 1 structural material also forms part of the capacitive displacement sensing structures 1730 disposed at the edges of the proof mass 1740. As depicted the stationary elements of the capacitive displacement sensing structures 1730 are also formed from silicon carbide (Silicon Carbide 2). However, in this instance the MAGACC MEMS 1700 has now been encapsulated with a fourth ceramic layer, in this instance Silicon Carbide 4, which has been deposited atop a patterned third ceramic layer, in this instance Silicon Carbide 3. These third and fourth ceramic layers Silicon Carbide 3 and Silicon Carbide 4 respectively may be similarly deposited through low temperature deposition processes. Alternatively, the fourth ceramic layer Silicon Carbide 4 may be replaced with another ceramic or an alternative encapsulation material such as parylene 2780 for example where rather than a hermetic or low leak rate seal a barrier with low permeability to gases is employed.

Figure 18:
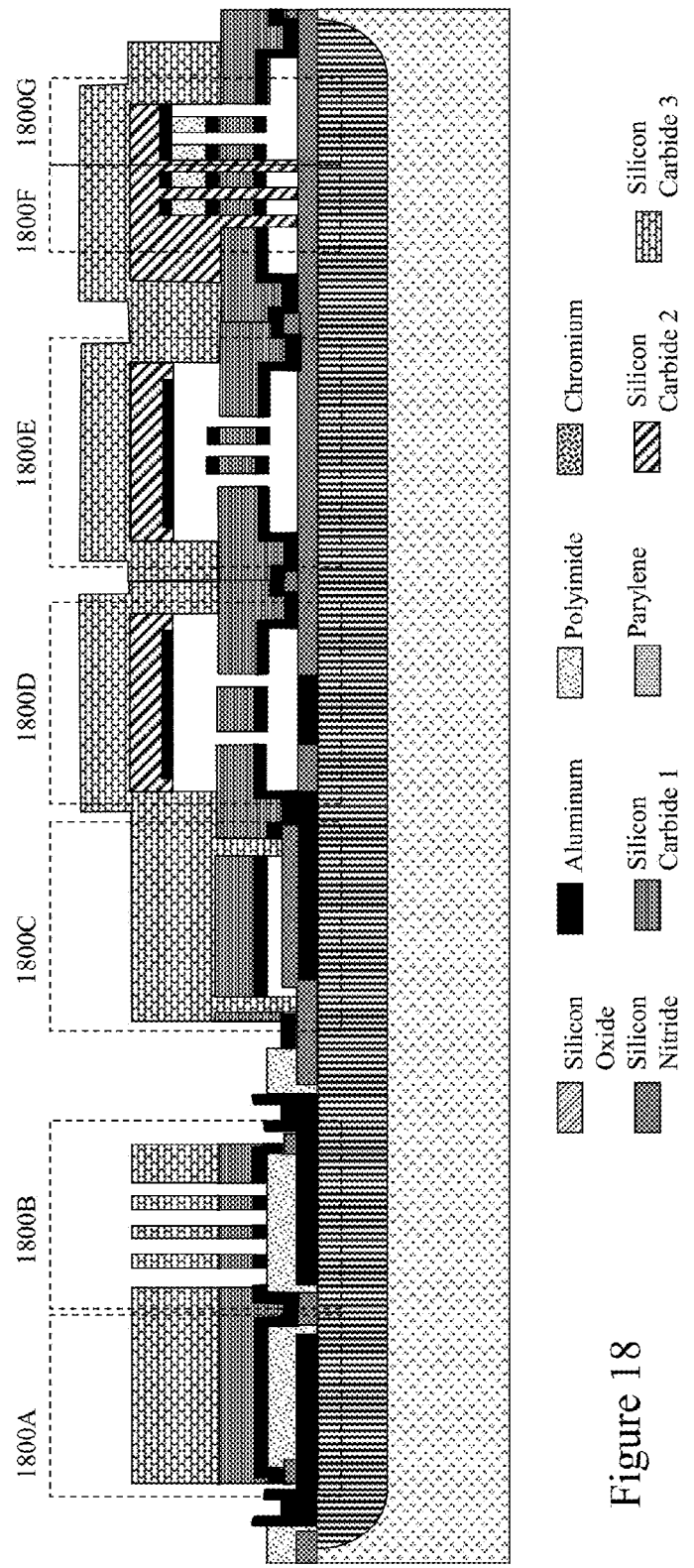
FIG. 18 depicts the integration of a magnetometer/accelerometer MEMS according to an embodiment of the invention with other capacitive MEMS devices employing a low temperature manufacturing process compatible with above CMOS integration.

Referring to FIG. 18 there is depicted a multi-function circuit cross-section according to an embodiment of the invention including MAGACC MEMS 1800D. As depicted the circuit also comprises a reference humidity element 1800A, humidity sensor 1800B, pressure sensor 1800C, clamped beam resonator 1800E, reference flow sensor 1800F and flow sensor 1800G. All of these elements are disposed above a CMOS circuit providing control electronics, drive circuitry, read-out circuitry and read-out interface/amplification circuitry, for example.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A microelectromechanical (MEMS) device comprising:
a structural member;
a plurality of supports suspending the structural member above a bottom electrode; and
a plurality of top electrical contacts, each top electrical contact associated with a support; wherein
the structural member acts as a current carrying element for a magnetometer operable in at least two dimensions; and
the structural member acts as a proof mass for an accelerometer operable in at least two dimensions and supporting concurrent use as a magnetometer and an accelerometer with the same structural MEMS element.

2. The MEMS device according to claim 1, wherein
the plurality of top electrical contacts provide for:
an electrical current to be driven along a first axis within the plane of the structural member; and
an electrical current to be driven along a second axis within the plane of the structural member perpendicular to the first axis; and
the bottom electrode allows for capacitance of a capacitor formed between the bottom electrode and suspended structural member.

3. The MEMS device according to claim 1, wherein
the plurality of top electrical contacts provide for:
a first electrical current to be driven along a first axis within the plane of the structural member via the plurality of top electrical contacts such that displacement of the structural element as a result of a Lorentz force due to any magnetic field along a second axis within the plane of the structural member perpendicular to the first axis can be detected via the bottom electrode; and
a second electrical current to be driven along the second axis via the plurality of top electrical contacts such that displacement of the structural element as a result of a Lorentz force due to any magnetic field along the first axis can be detected via the bottom electrode; wherein
the bottom electrode provides for the capacitance determinations if either the first electrical current and second electrical current and for capacitance determination when neither of the first electrical current and second electrical current are being driven to determine any motion to inertial force along a third axis mutually perpendicular to both the first axis and the second axis.

4. The MEMS device according to claim 1, wherein
at least one of electrical control and electrical drive signals to the MEMS device are varied according to a predetermined sequence in order to provide a series of measurements allowing at least one of magnetic field and acceleration data to be generated and the effect of acceleration on the magnetic field measurements to be removed.

5. The MEMS device according to claim 1 wherein,
the MEMS device operates as a magnetometer in at least three dimensions.

6. The MEMS device according to claim 1 wherein,
the MEMS device operates as an accelerometer in at least three dimensions.

* * * * *